United States Patent [19]

Lazansky et al.

[11] Patent Number: 5,111,413
[45] Date of Patent: May 5, 1992

[54] COMPUTER-AIDED ENGINEERING

[75] Inventors: Richard W. Lazansky, Pleasanton; Thomas R. Miller, Palo Alto; David R. Coelho, Fremont; Kenneth E. Scott, Fremont; Alec G. Stanculescu, San Mateo, all of Calif.

[73] Assignee: Vantage Analysis Systems, Inc., Fremont, Calif.

[21] Appl. No.: 328,427

[22] Filed: Mar. 24, 1989

[51] Int. Cl.$^5$ .............................................. G06F 15/20
[52] U.S. Cl. ...................................... 364/578; 364/488
[58] Field of Search ................. 364/578, 488, 489, 490

[56] References Cited

U.S. PATENT DOCUMENTS

| | | | |
|---|---|---|---|
| T940,013 | 11/1975 | Ho | 364/489 |
| 4,656,603 | 4/1987 | Dunn | 364/900 |
| 4,725,971 | 2/1988 | Doshi et al. | 364/578 |
| 4,763,288 | 8/1988 | Deering et al. | 364/578 |
| 4,815,003 | 3/1989 | Putatunda et al. | 364/489 |
| 4,827,427 | 5/1989 | Hyduke | 364/578 |
| 4,827,428 | 5/1989 | Dunlop et al. | 364/488 |
| 4,862,460 | 8/1989 | Yamaguchi | 371/27 |
| 4,868,785 | 9/1989 | Jordan et al. | 364/900 |
| 4,907,180 | 3/1990 | Smith | 364/578 |
| 4,942,615 | 7/1990 | Hirose | 364/578 |
| 4,967,386 | 10/1990 | Maeda et al. | 364/578 |

OTHER PUBLICATIONS

Hwang et al.; "Incremental Functional Simulation of Digital Circuits"; Abstract only 1987.

Hwang et al.; "Fast Functional Simulation: An Incremental Approach"; IEEE Trans. Com. Des.; vol. 7, No. 7, Jul. 1988.

Hollis, Chapter 6, *Design of VLSI Gate Array ICs*, Prentice-Hall, 1987, pp. 220–268.

Salz et al., "IRSIM: An Incremental MOS Switch-Level Simulator," *ACM/IEEE* (Aug. 1989).

Advertising brochure, "Verilog XL," Gateway Design Automation Corporation.

Advertising brochure, "Daisy design and verification tools: The foundation for a better design," Daisy Systems.

*Primary Examiner*—Parshotam S. Lall
*Assistant Examiner*—Ellis B. Ramirez
*Attorney, Agent, or Firm*—Townsend and Townsend

[57] ABSTRACT

A simulation system for circuit design is disclosed. The system couples a schematic editor and simulator to allow incremental changes to a design under test without requiring prior shutdown of the simulator. The system uses a method which permits a wide range of changes to the design and provides a resulting netlist for the changed design. Changes can be made to the schematic which include changes in hierarchy, addition or deletion of components (including hierarchical components), addition or deletion of signals at any level within the design hierarchy, addition or deletion of interconnections of components at any level of hierarchy within the design, addition and deletion of interface ports for any component type, substitution of a new component for an existing one (including swapping hierarchical and behavioral descriptions), and alteration of parametric data such as device delay timing. The simulation continues to run after design changes are made. The method may be used in conjunction with hardware modeling systems.

33 Claims, 30 Drawing Sheets

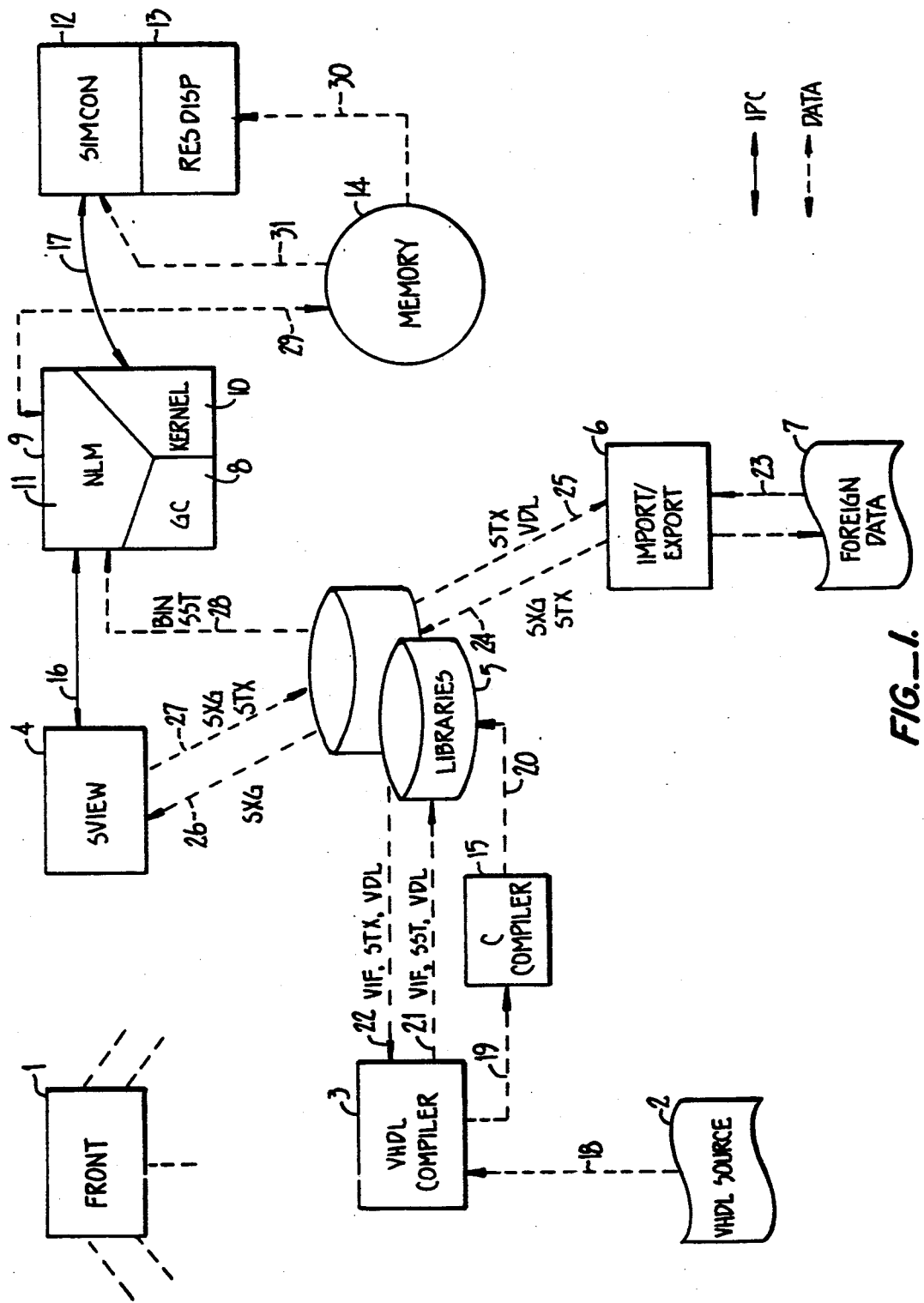
FIG._1.

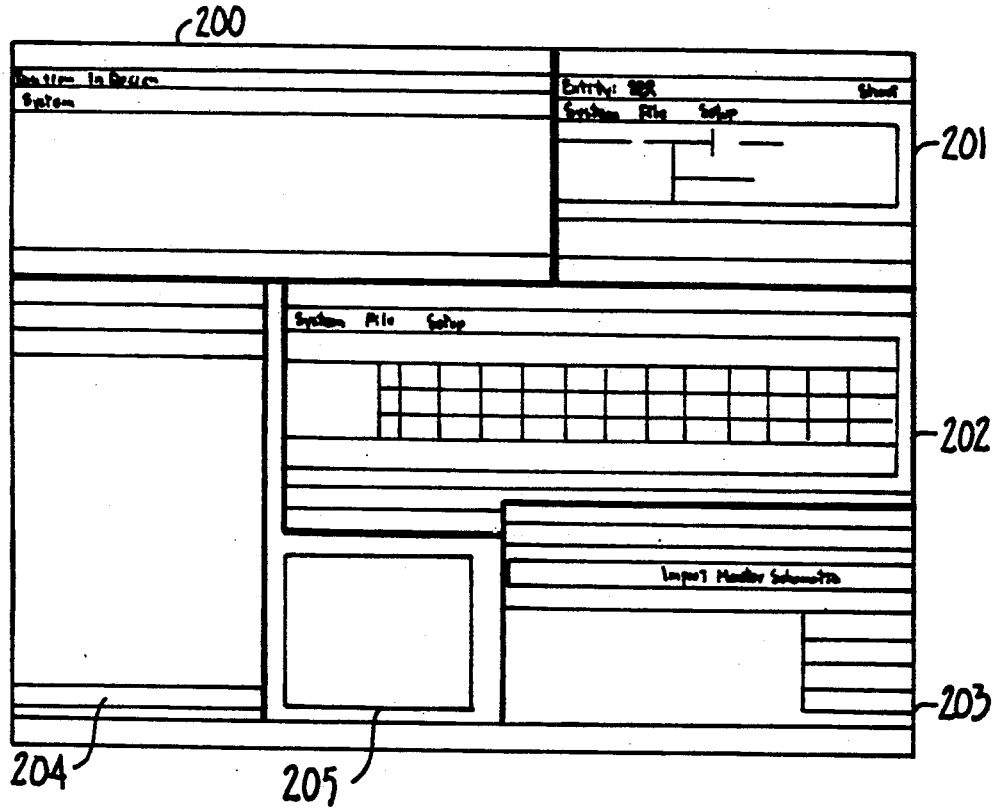
FIG._2.

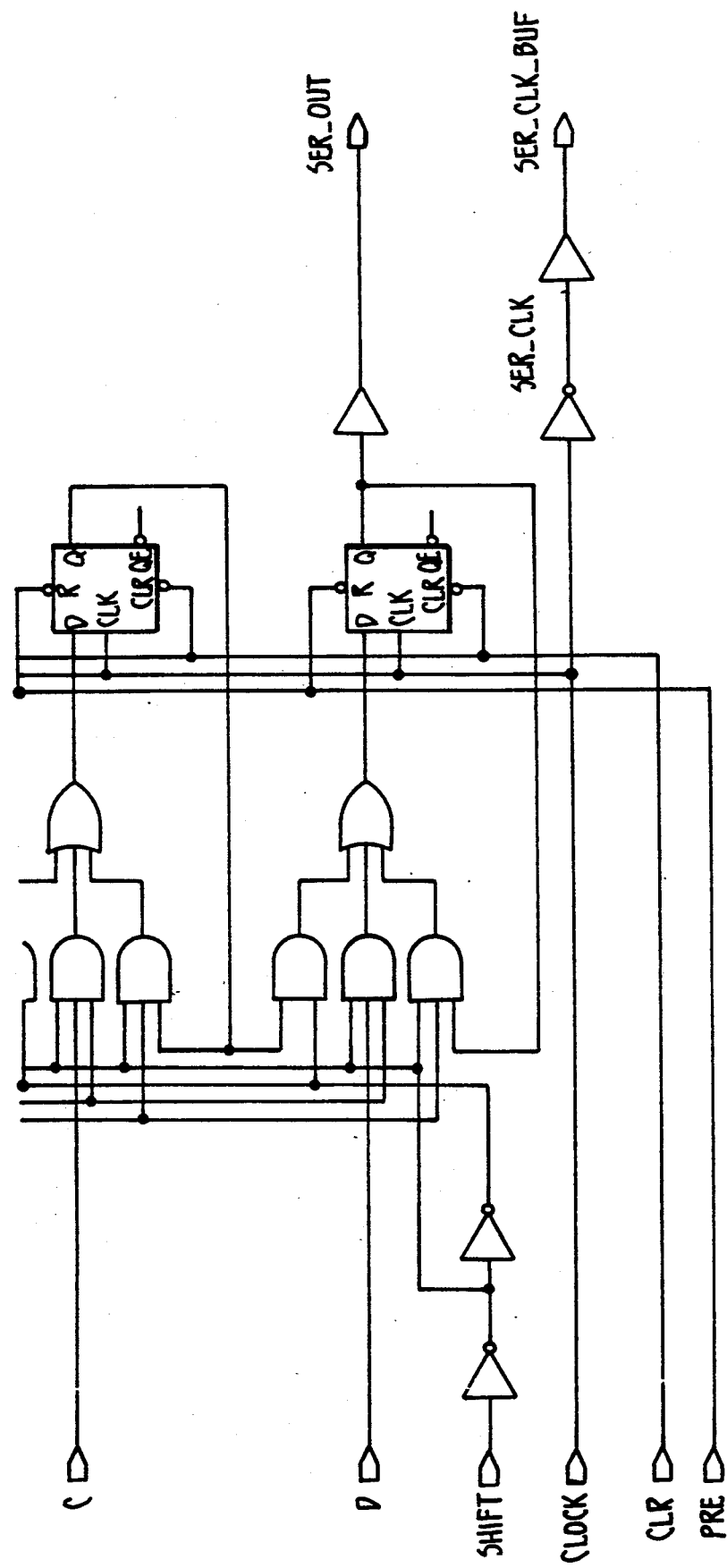
FIG._3a.

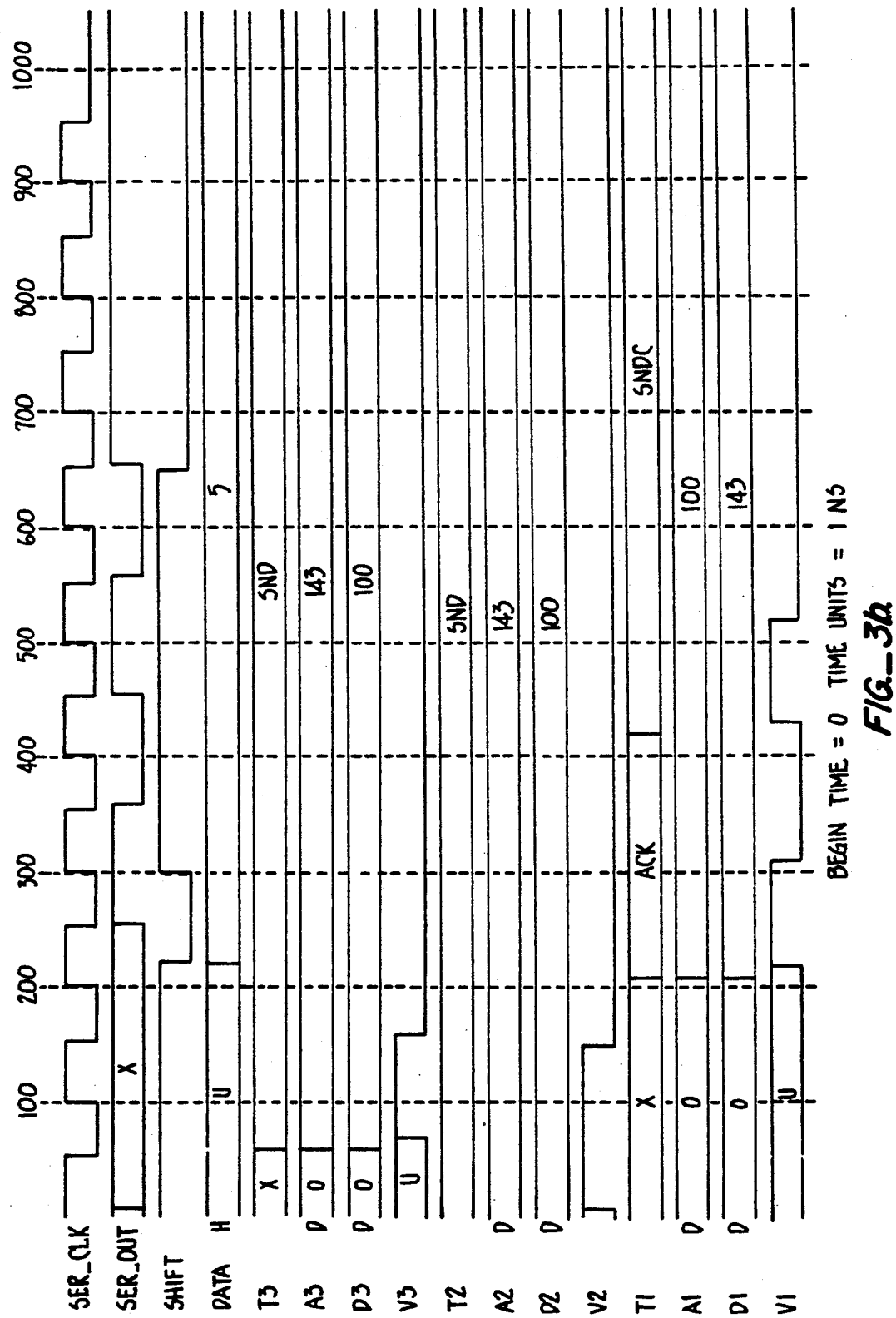
FIG._3b

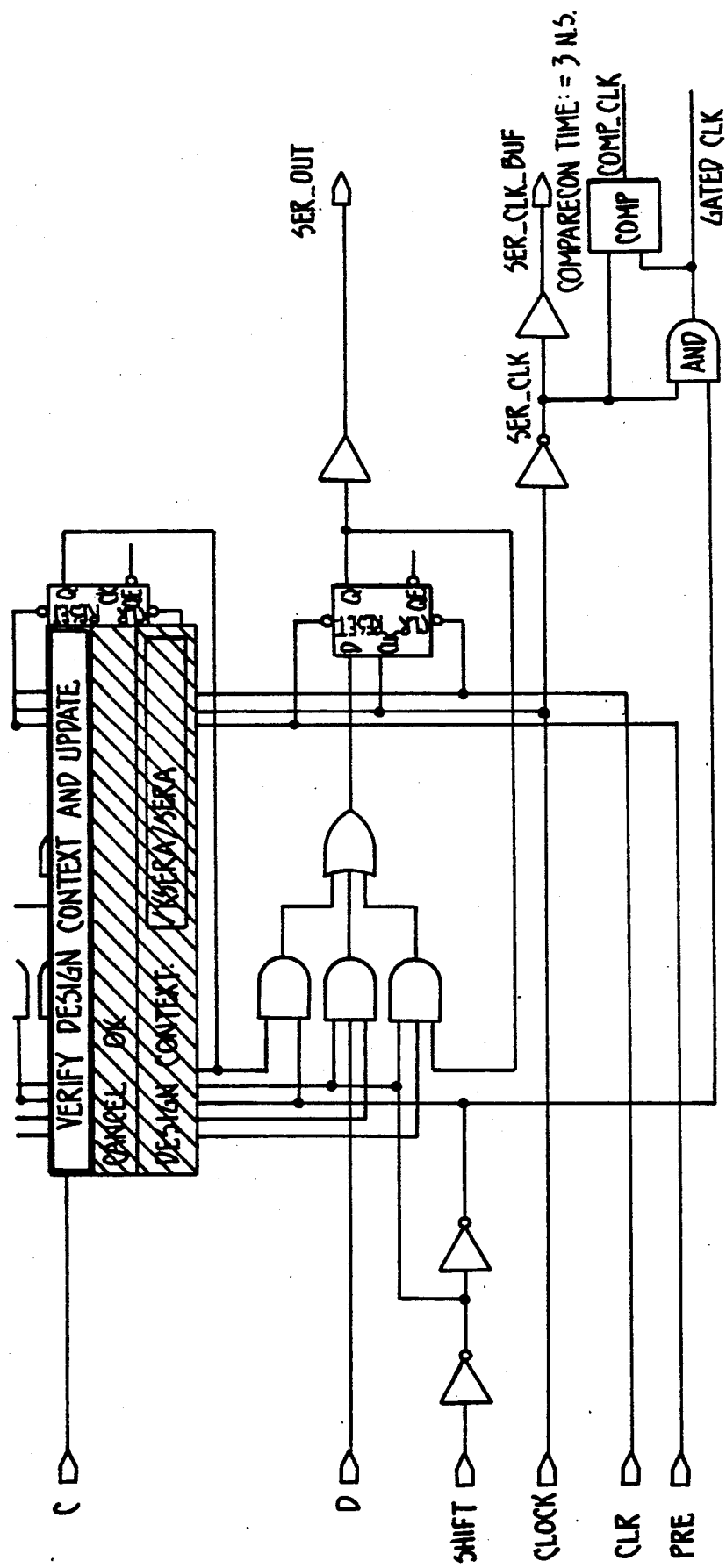
FIG._3c.

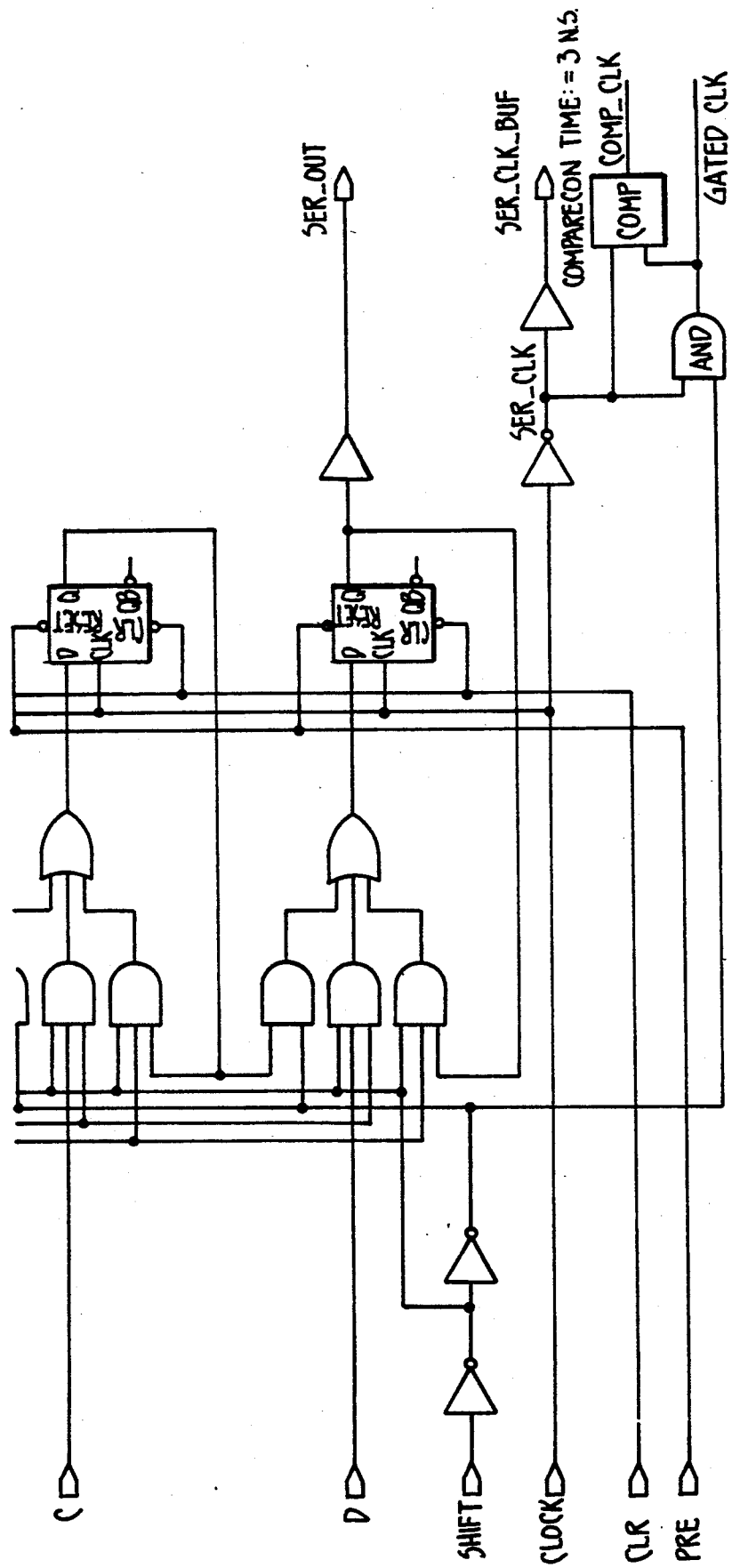
FIG._3d

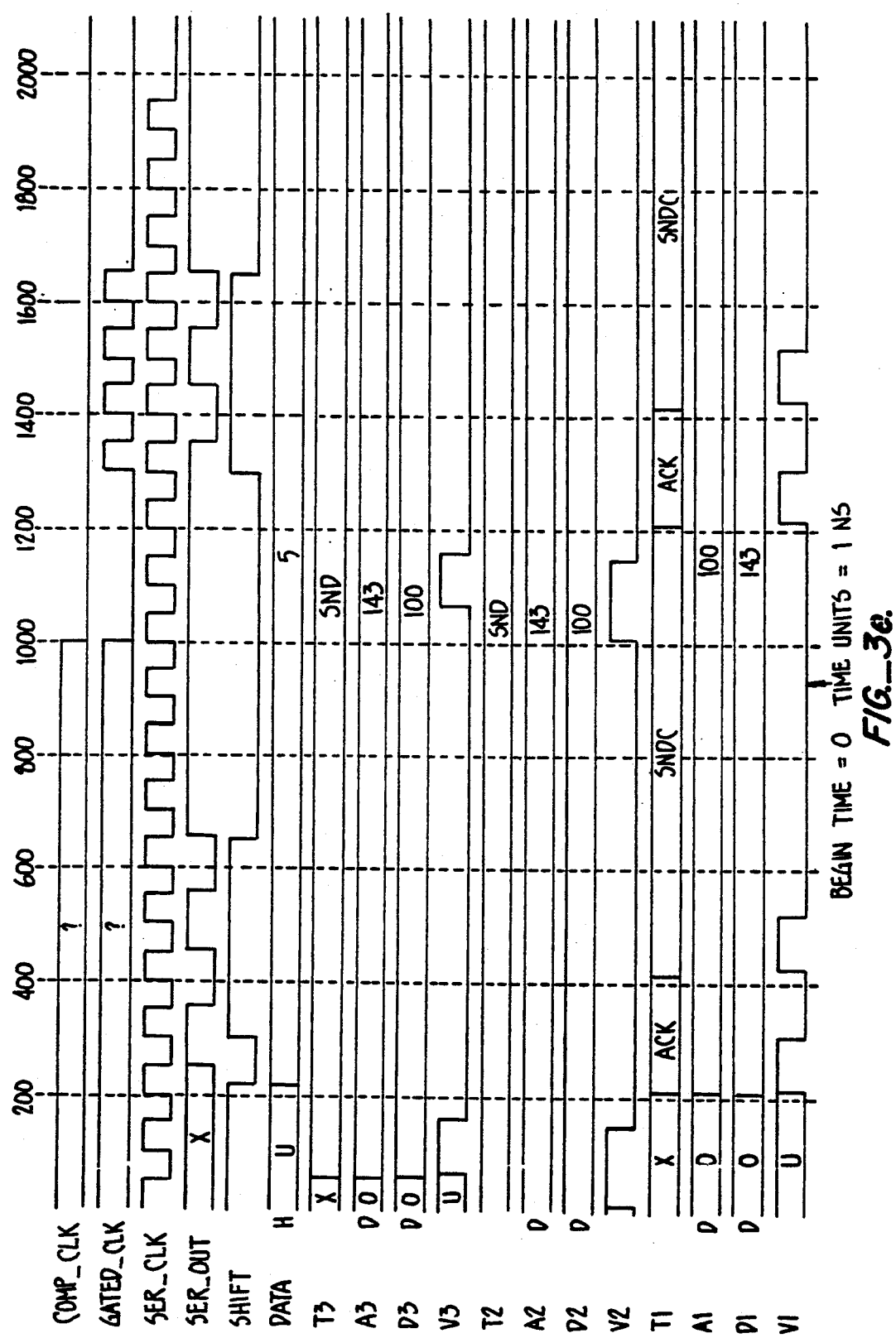
FIG._3e.

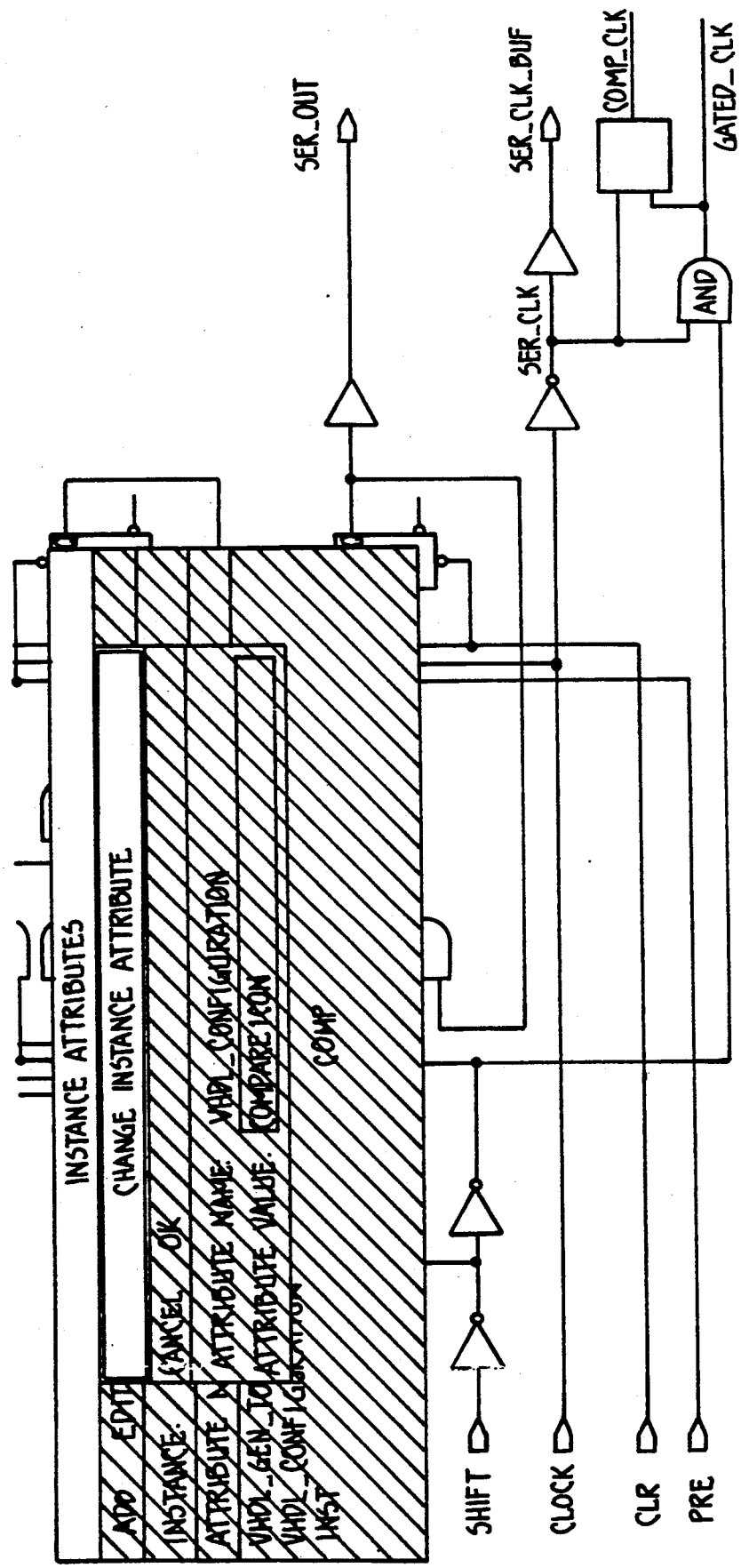
FIG._3f.

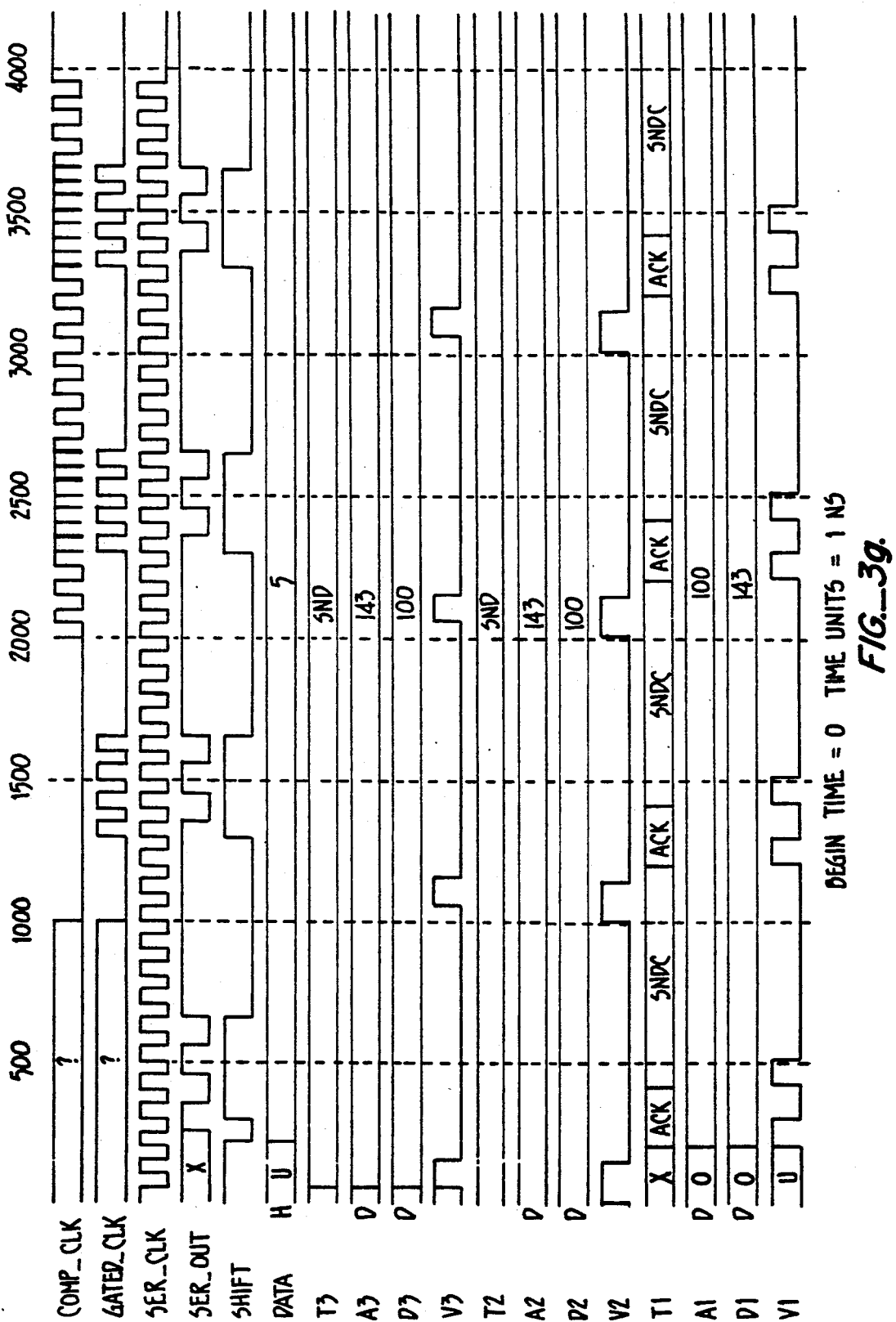
FIG._3g.

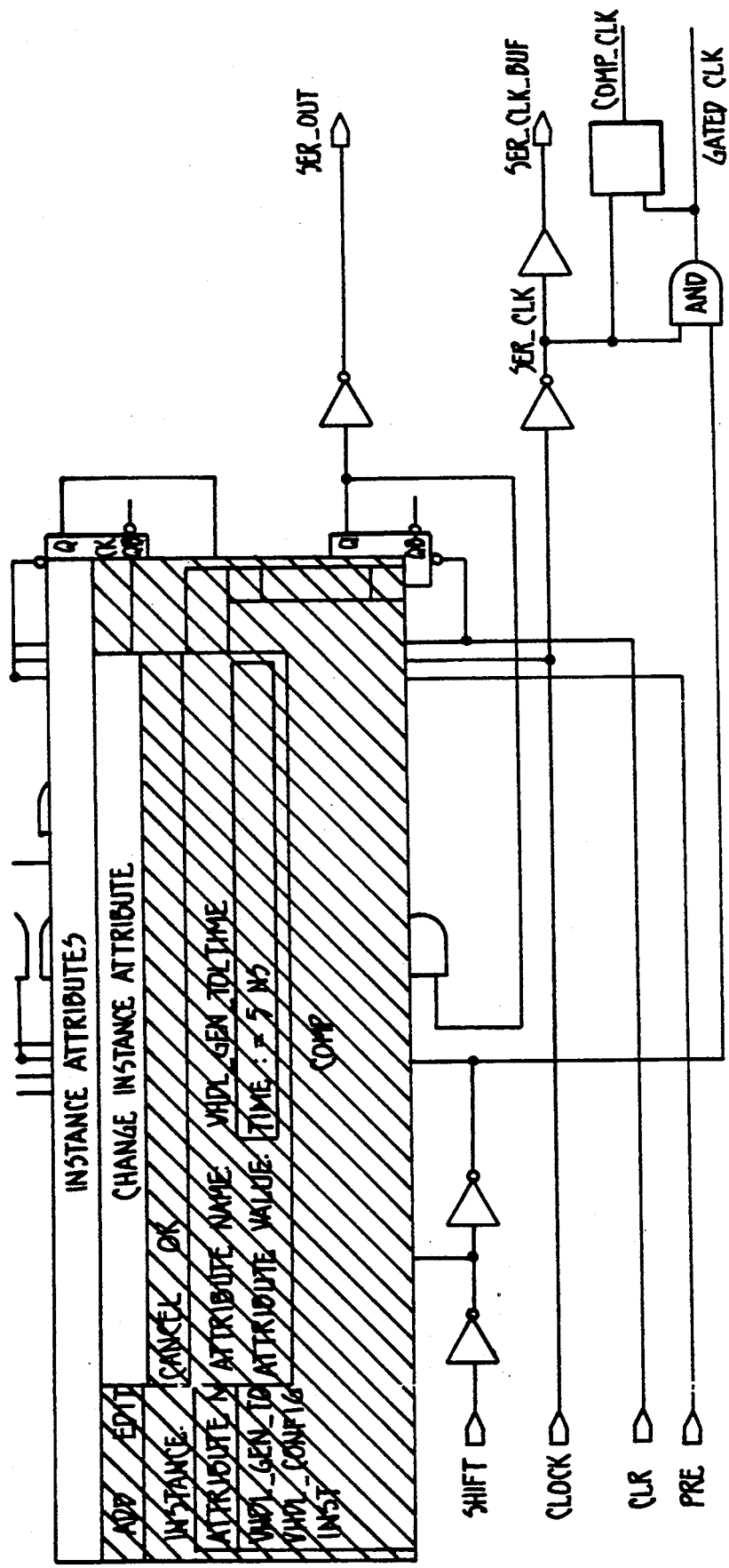
FIG._3h.

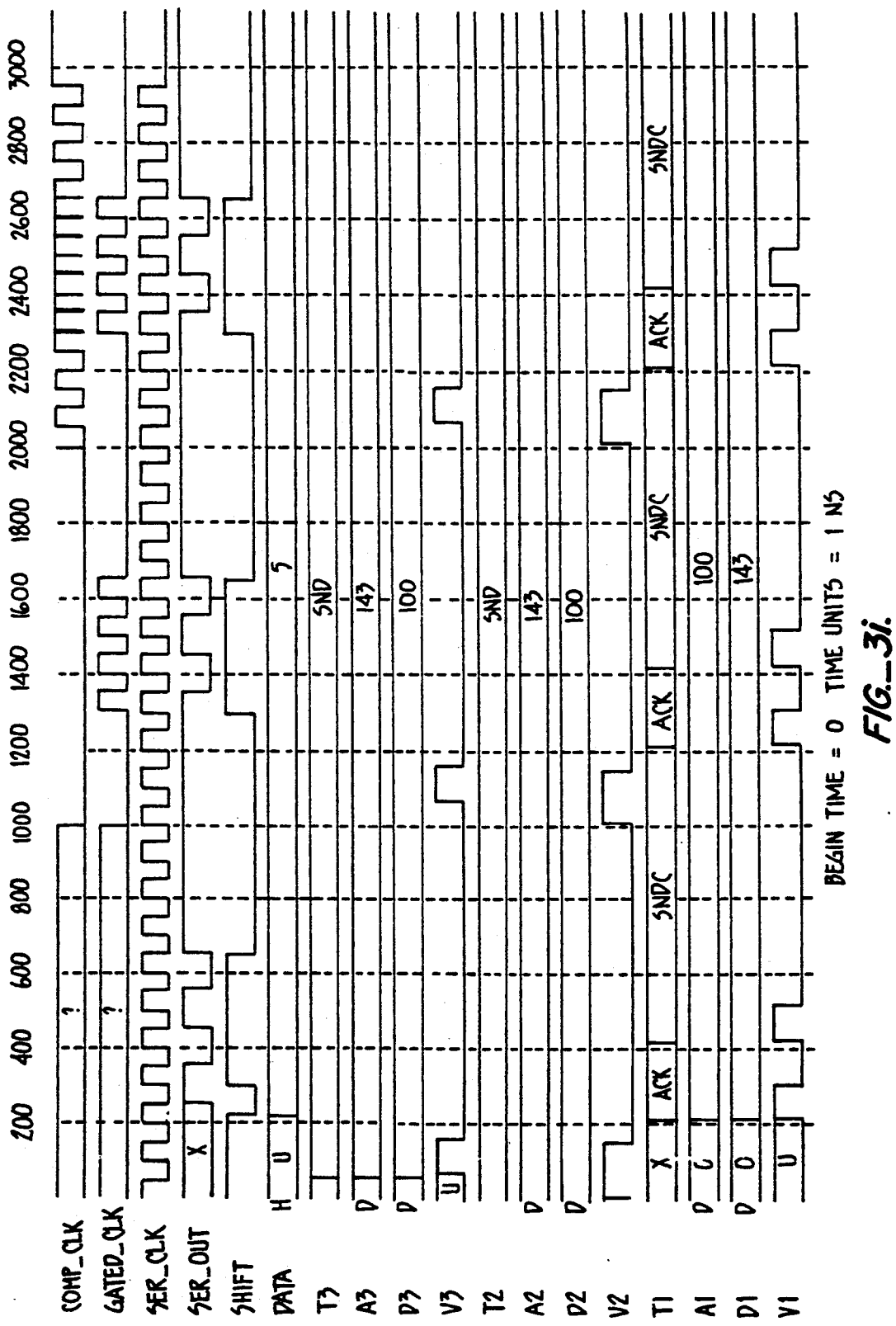
FIG._3i.

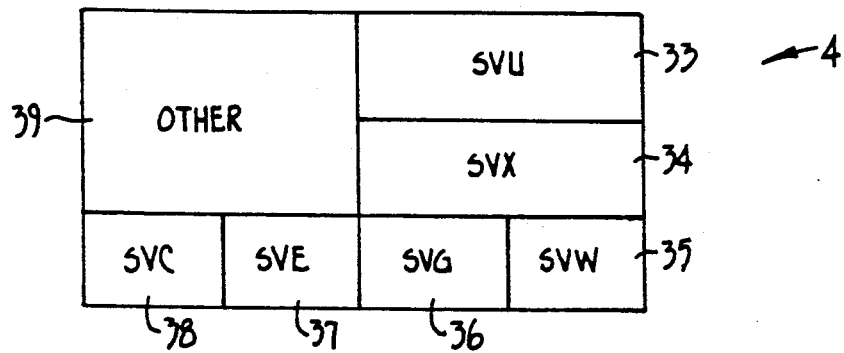
FIG._4.
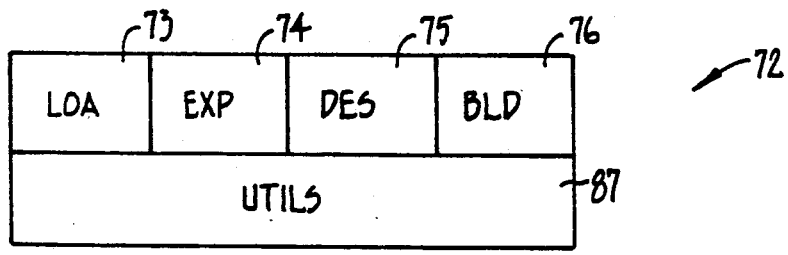
FIG._7.
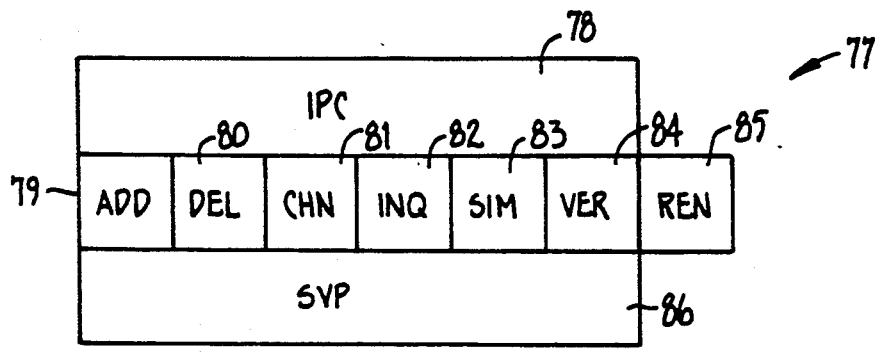
FIG._8.
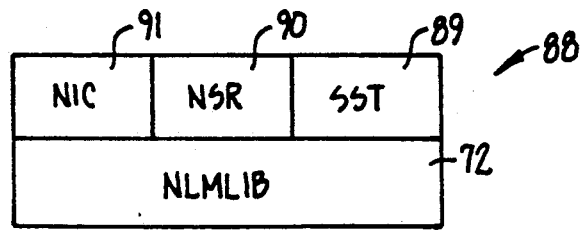
FIG._9.

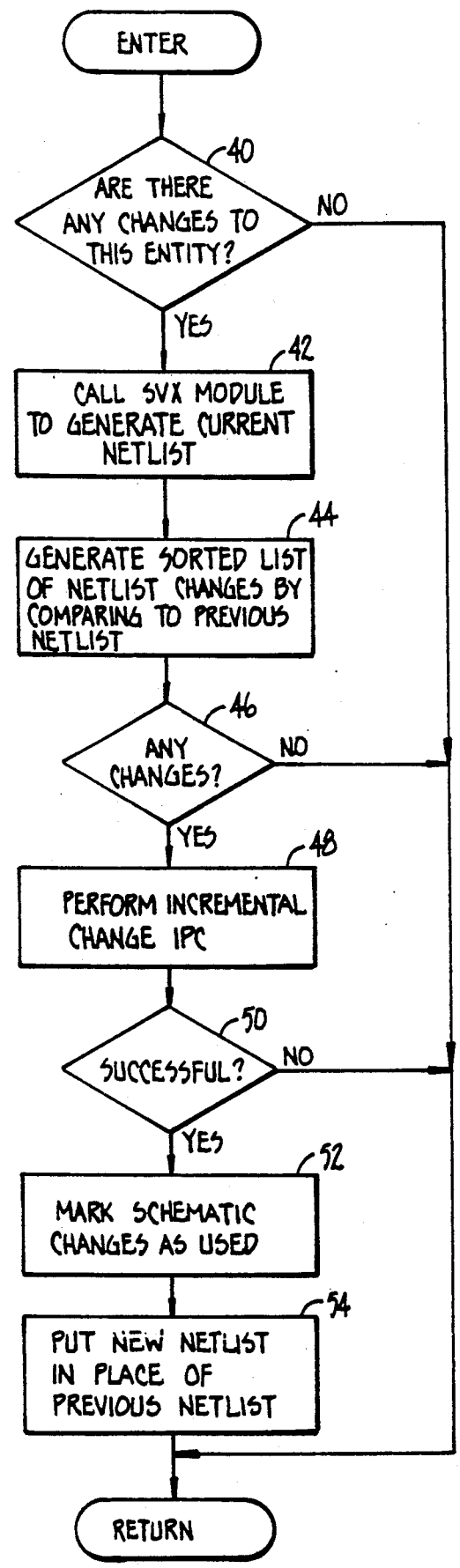
FIG._5.

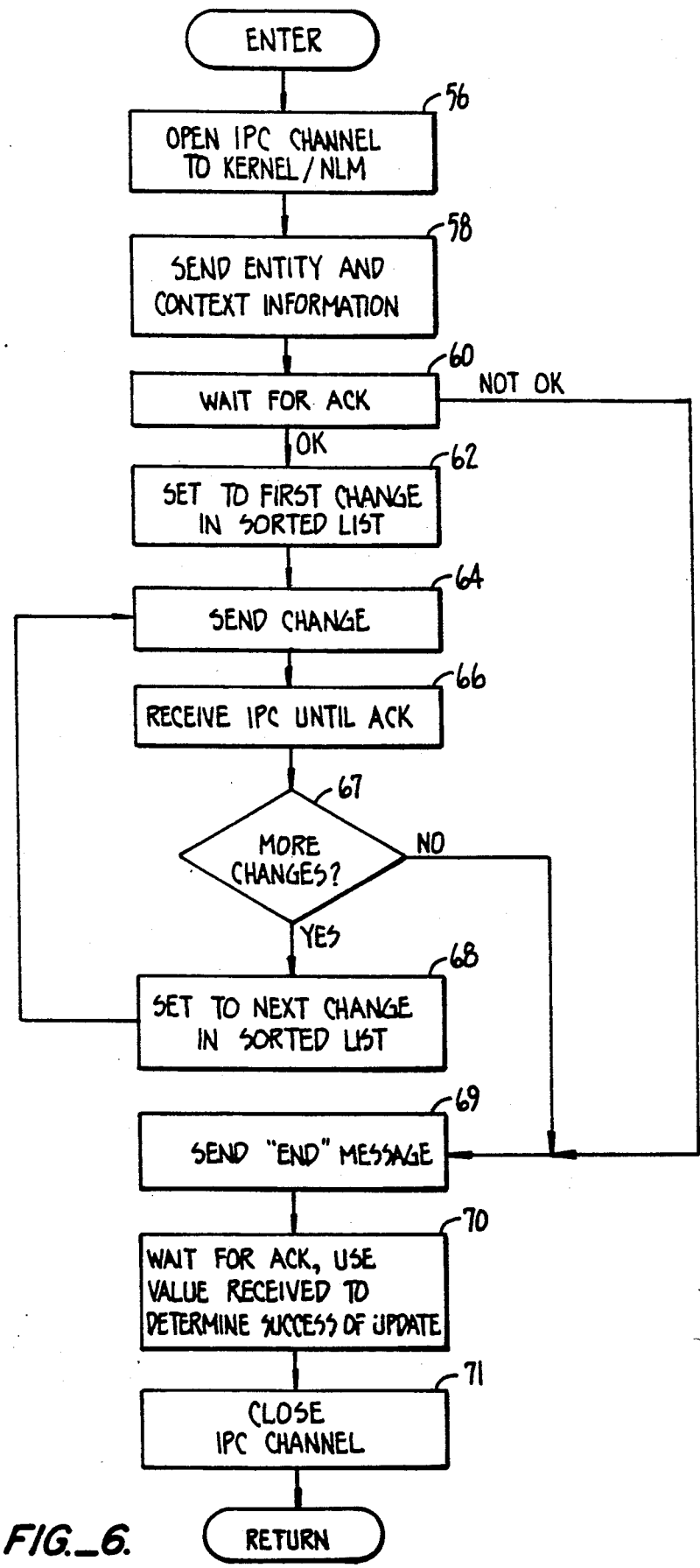
FIG._6.

TREE OF NLM ENTRY Ts
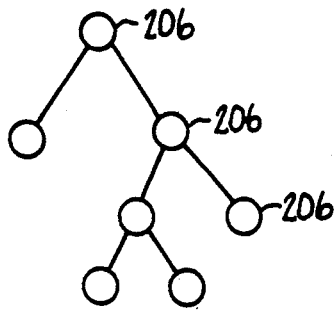
FIG._10.
SINGLE EXAMPLE OF AN NLM ENTRY T
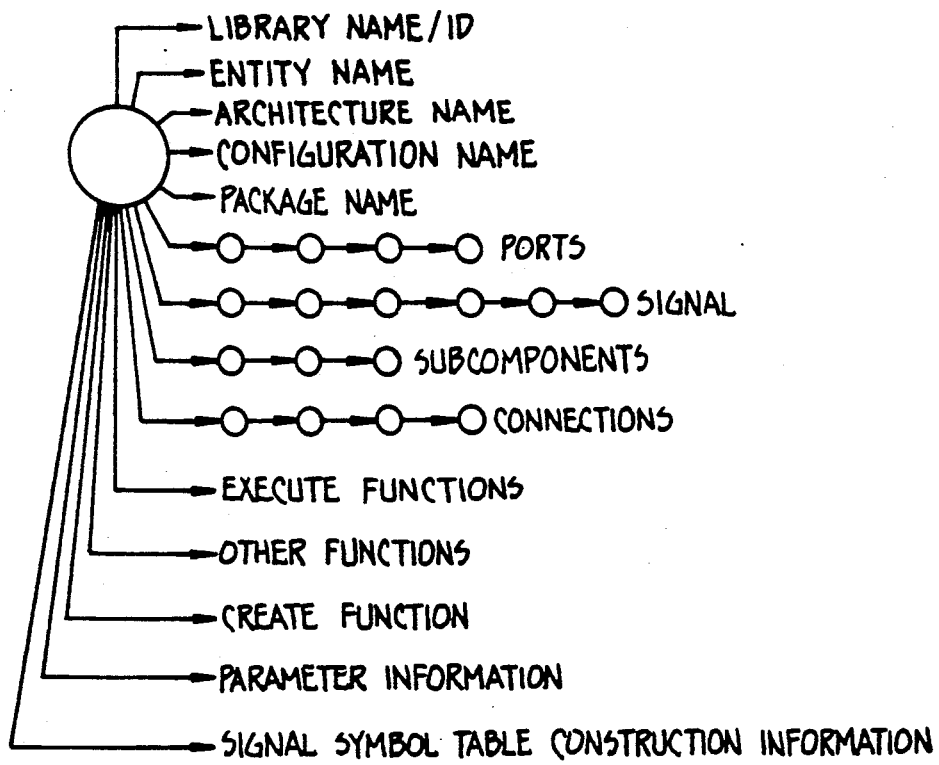
FIG._11.

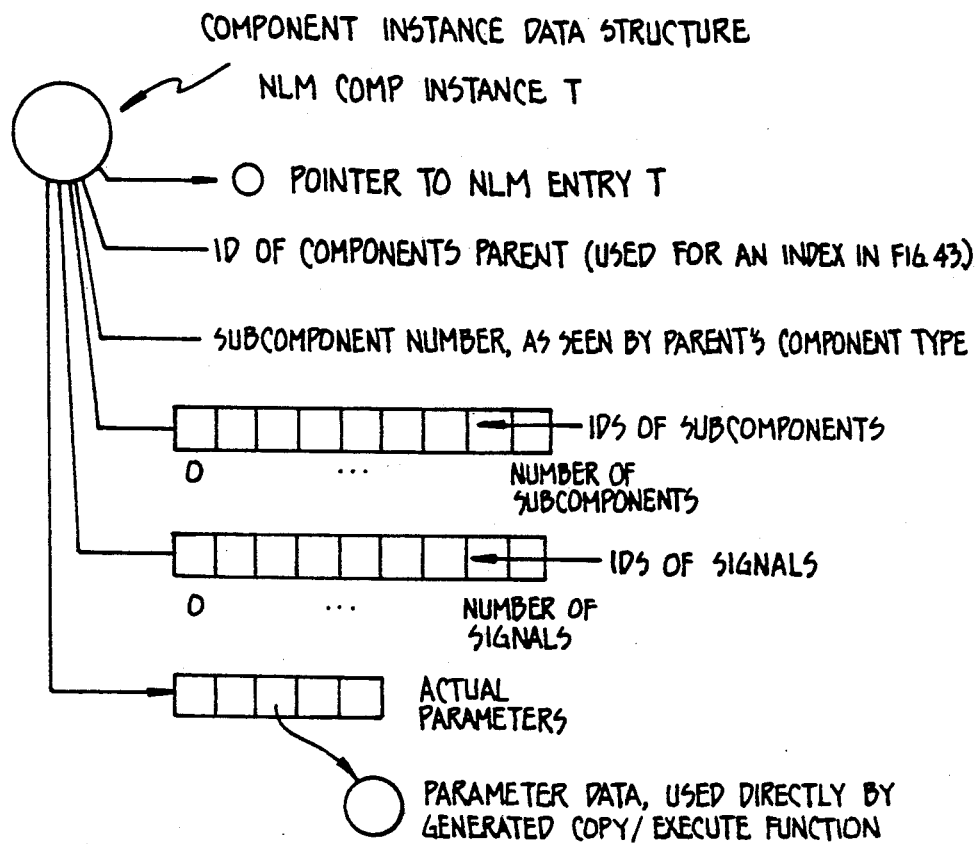
FIG._12.
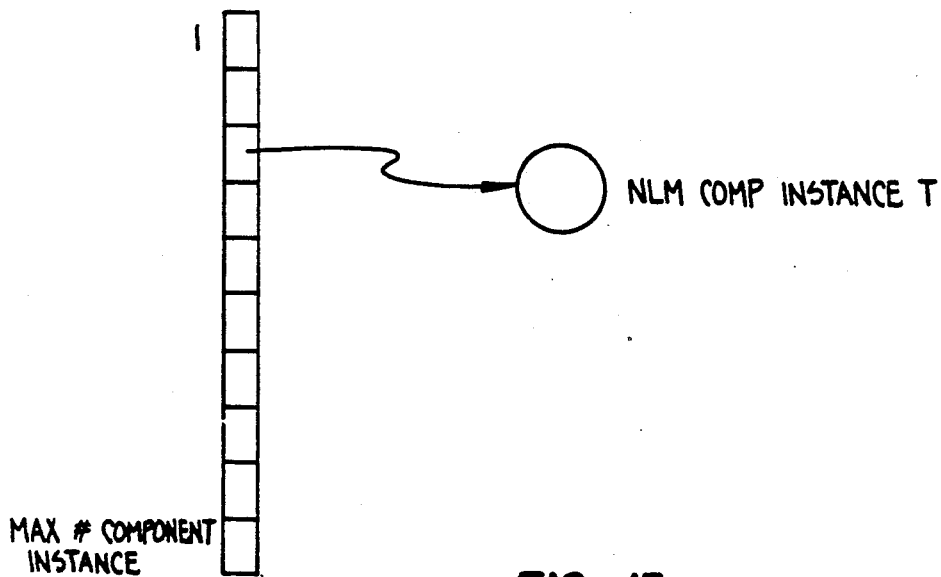
FIG._13.

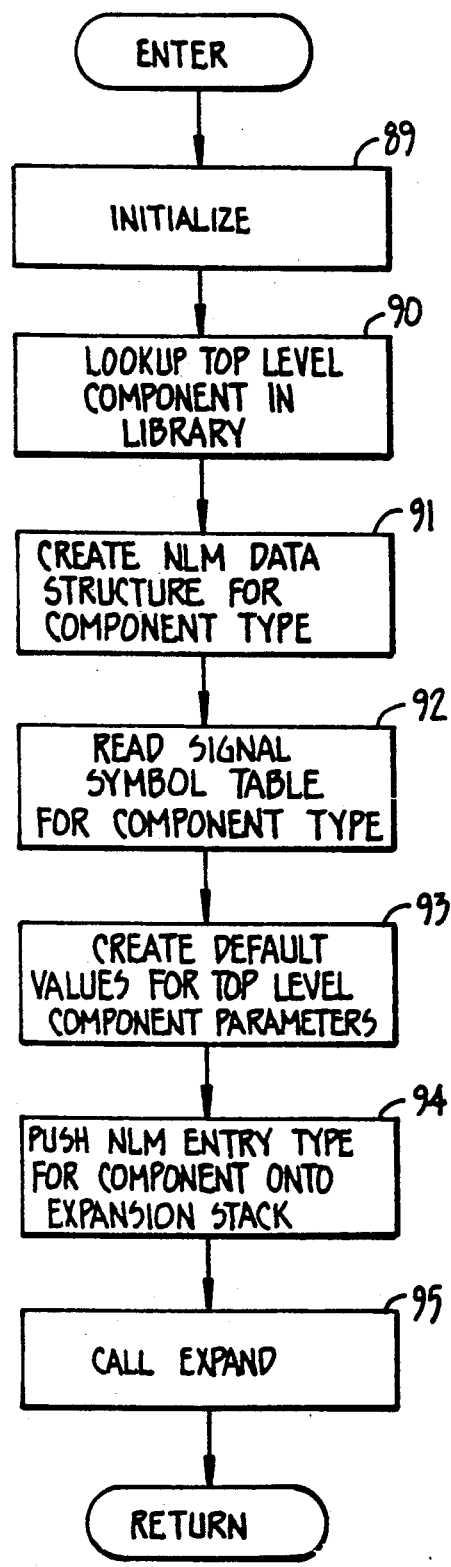
FIG._14.

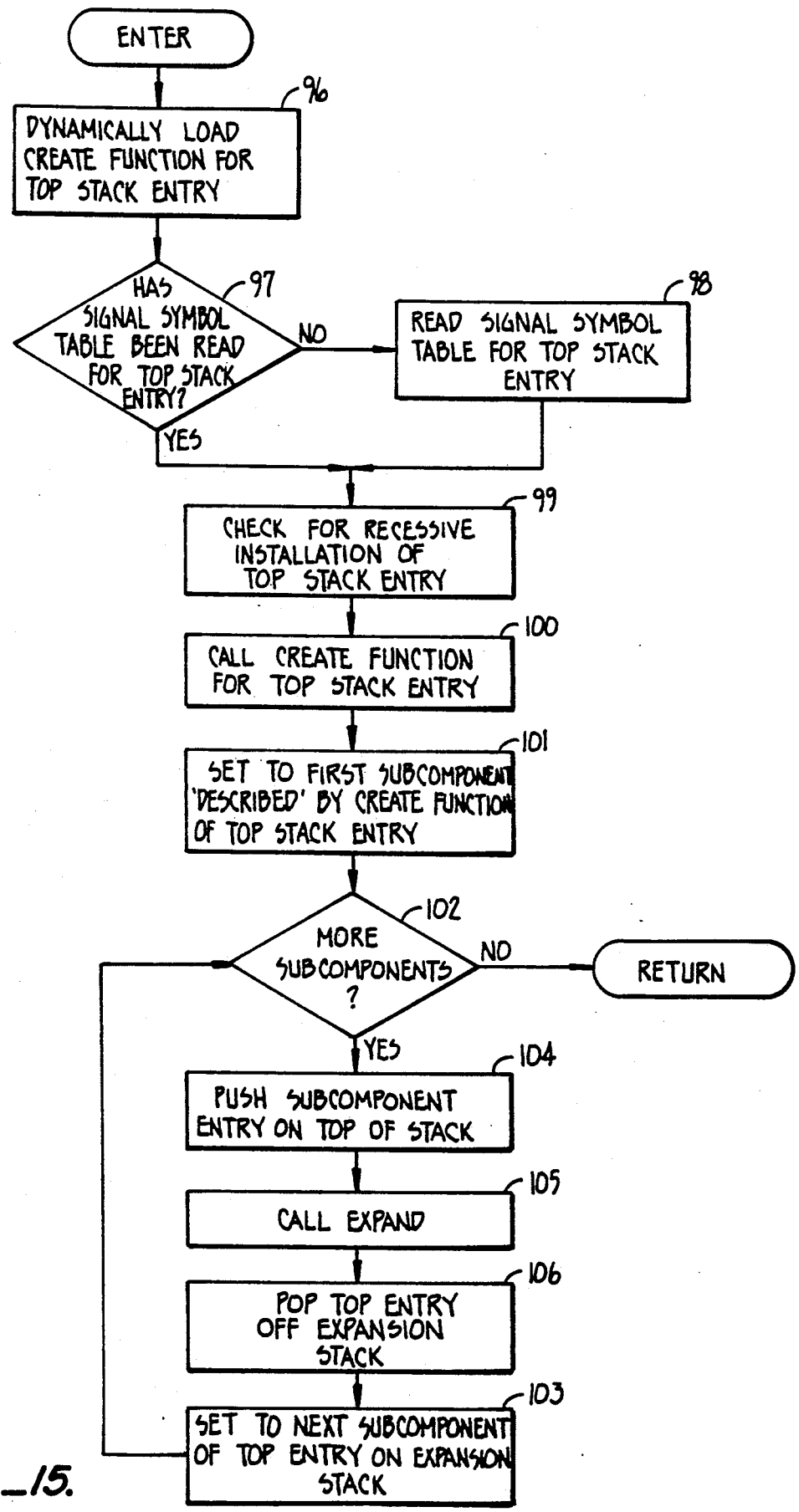
FIG._15.

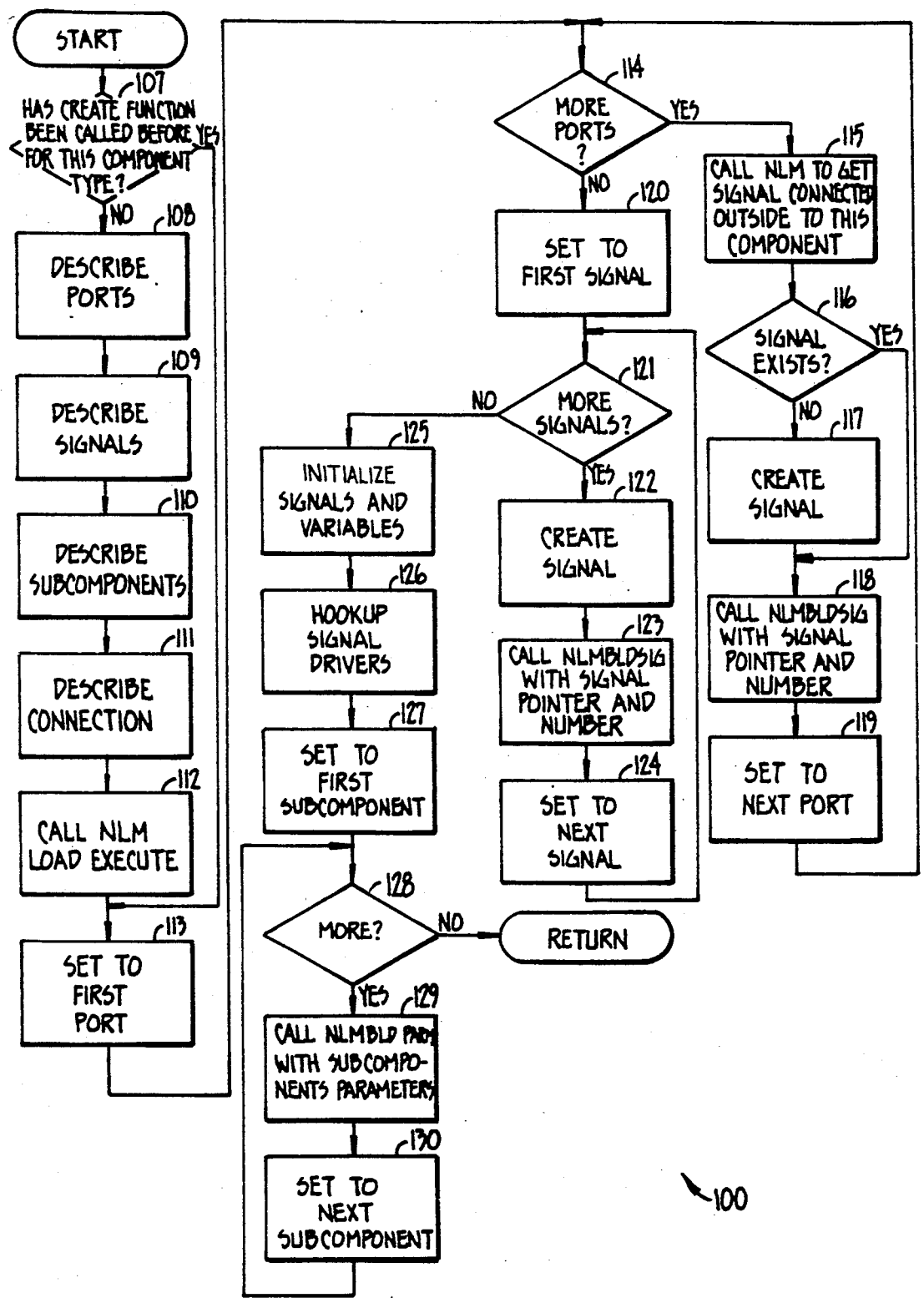
FIG._16.

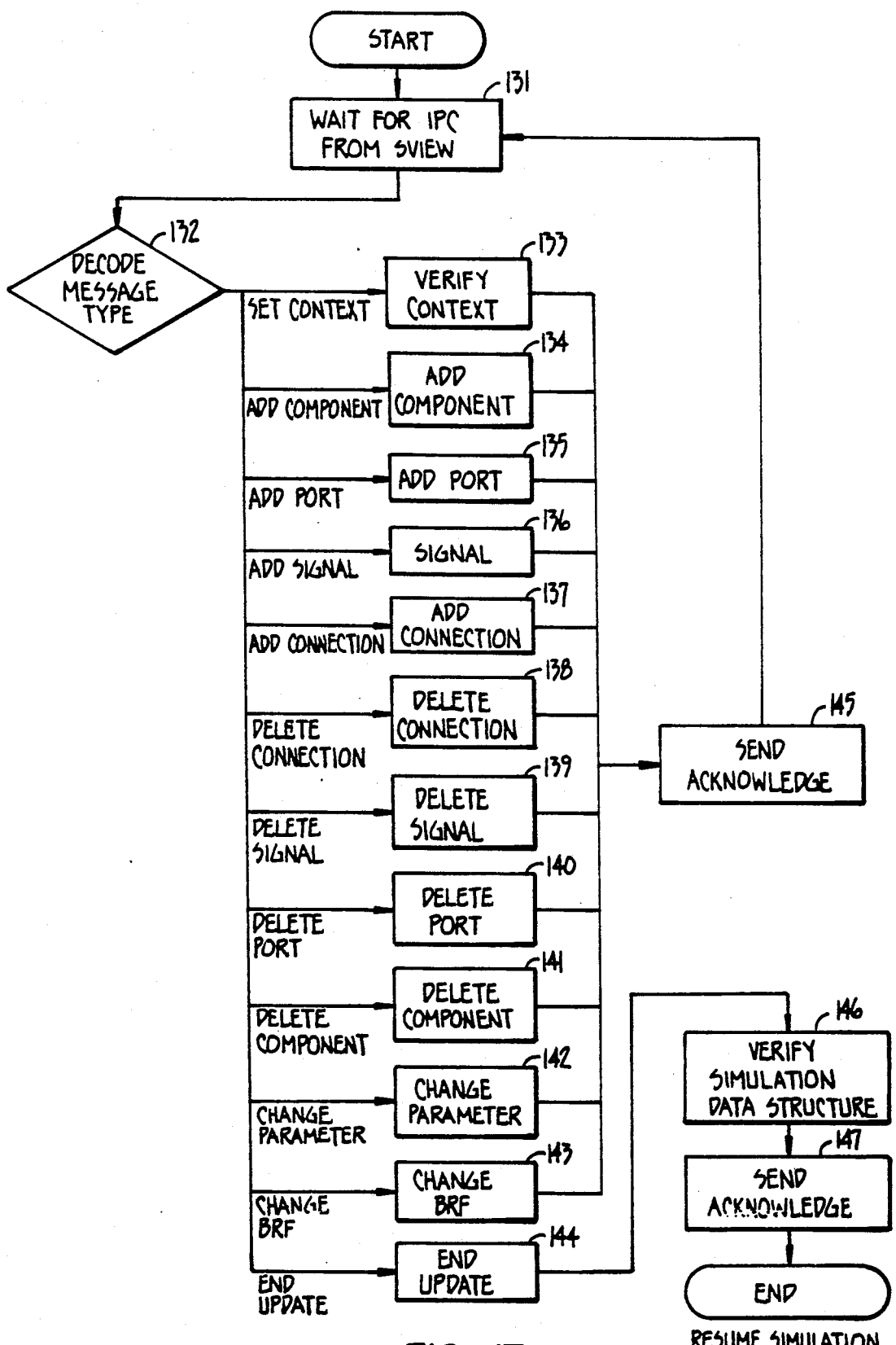
FIG._17.

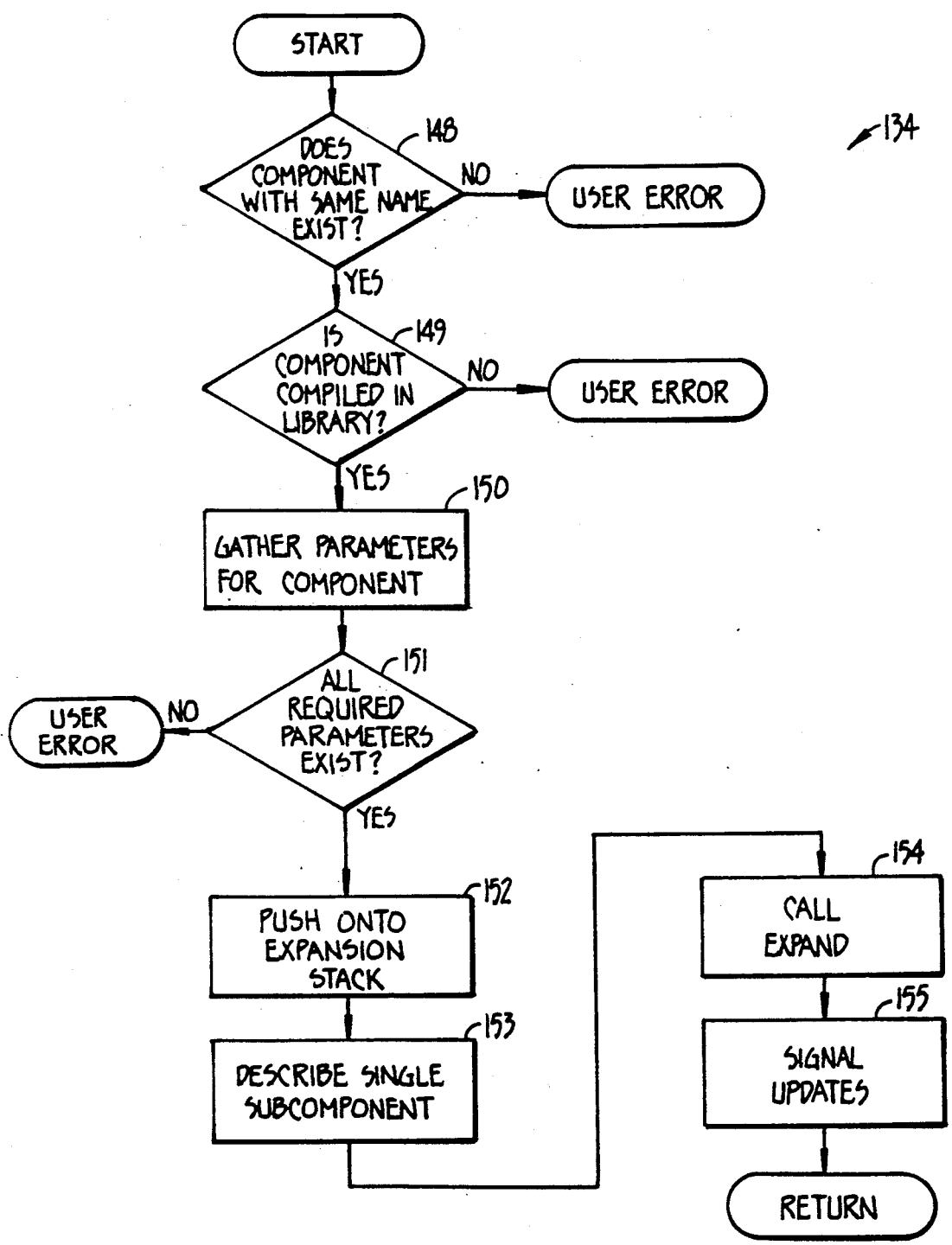
FIG._18.

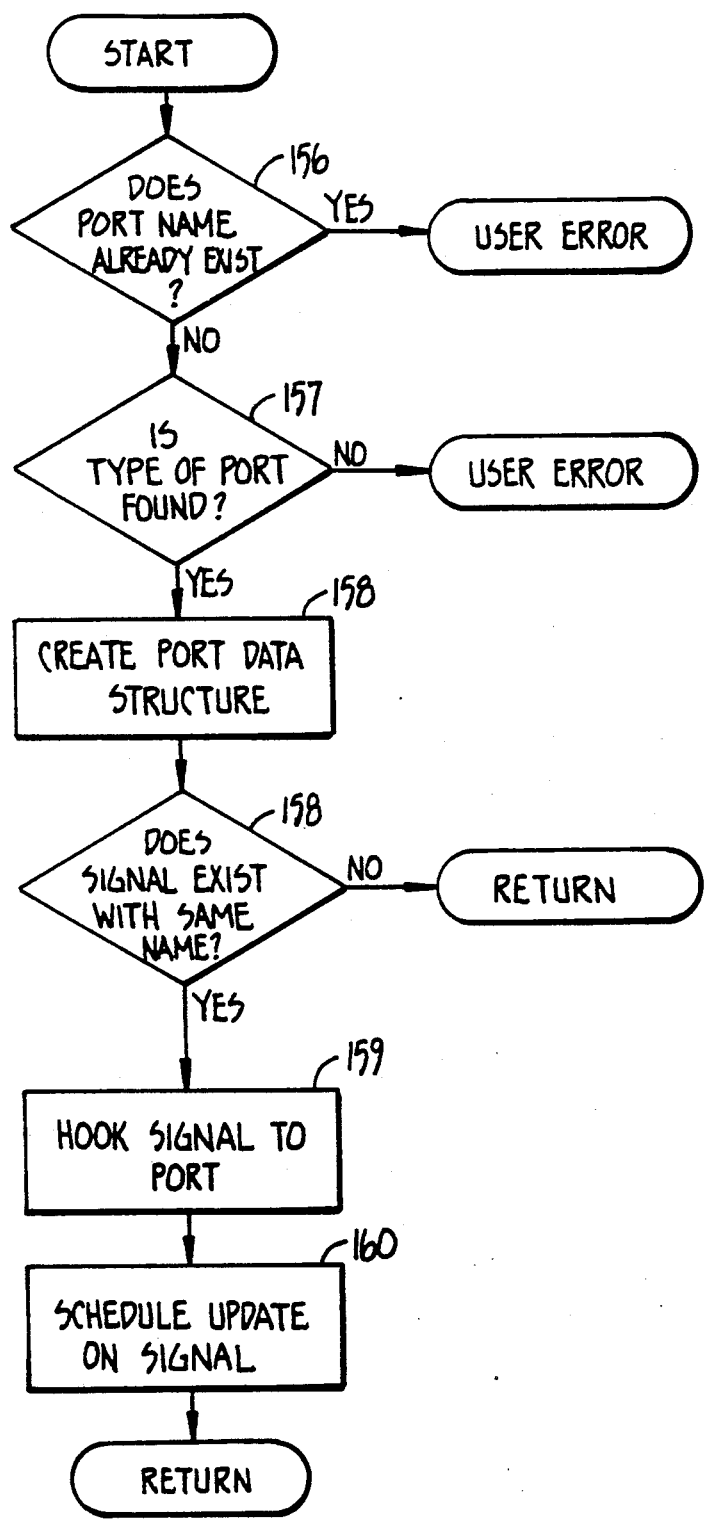
FIG._19.

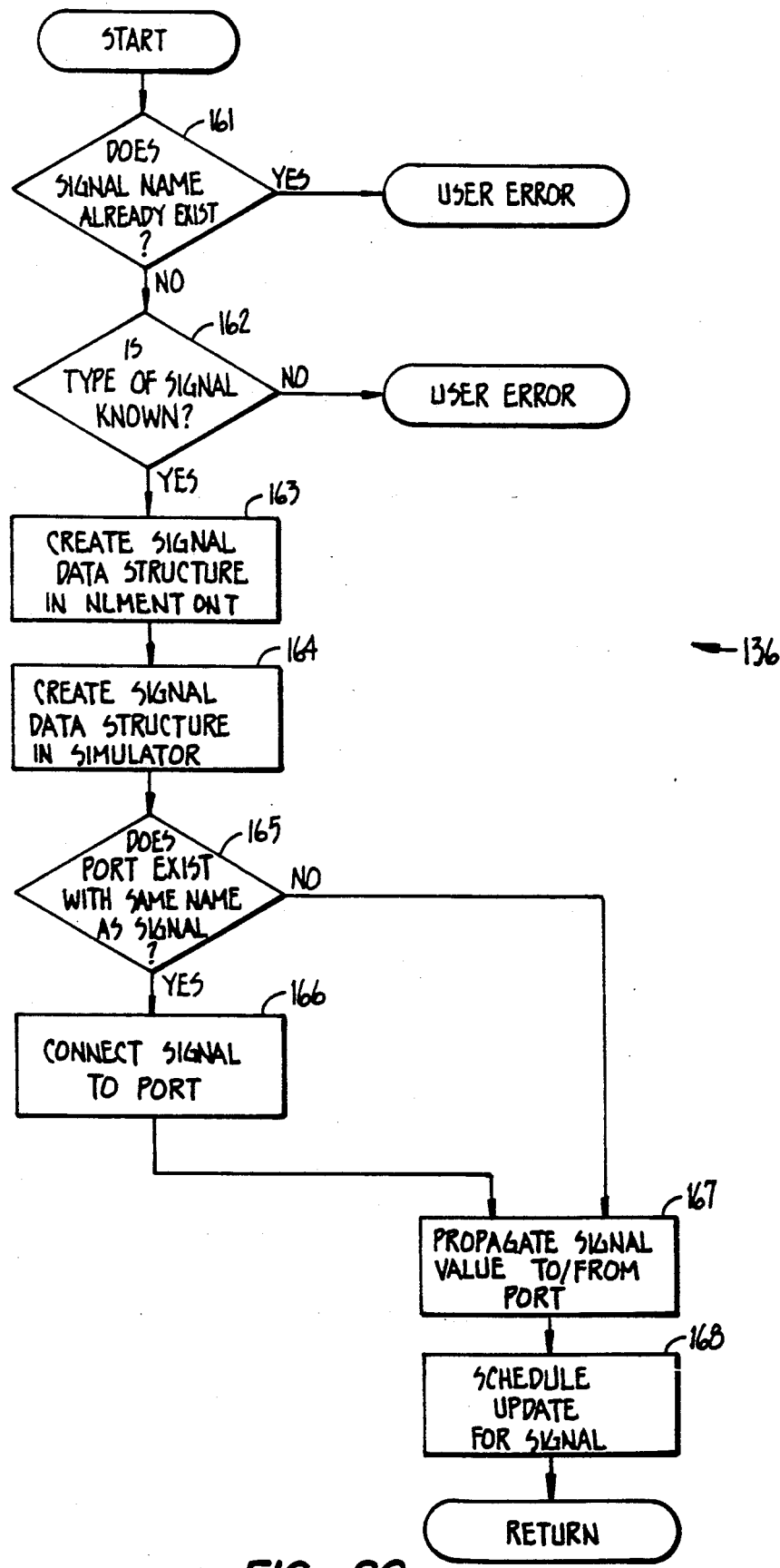
FIG._20.

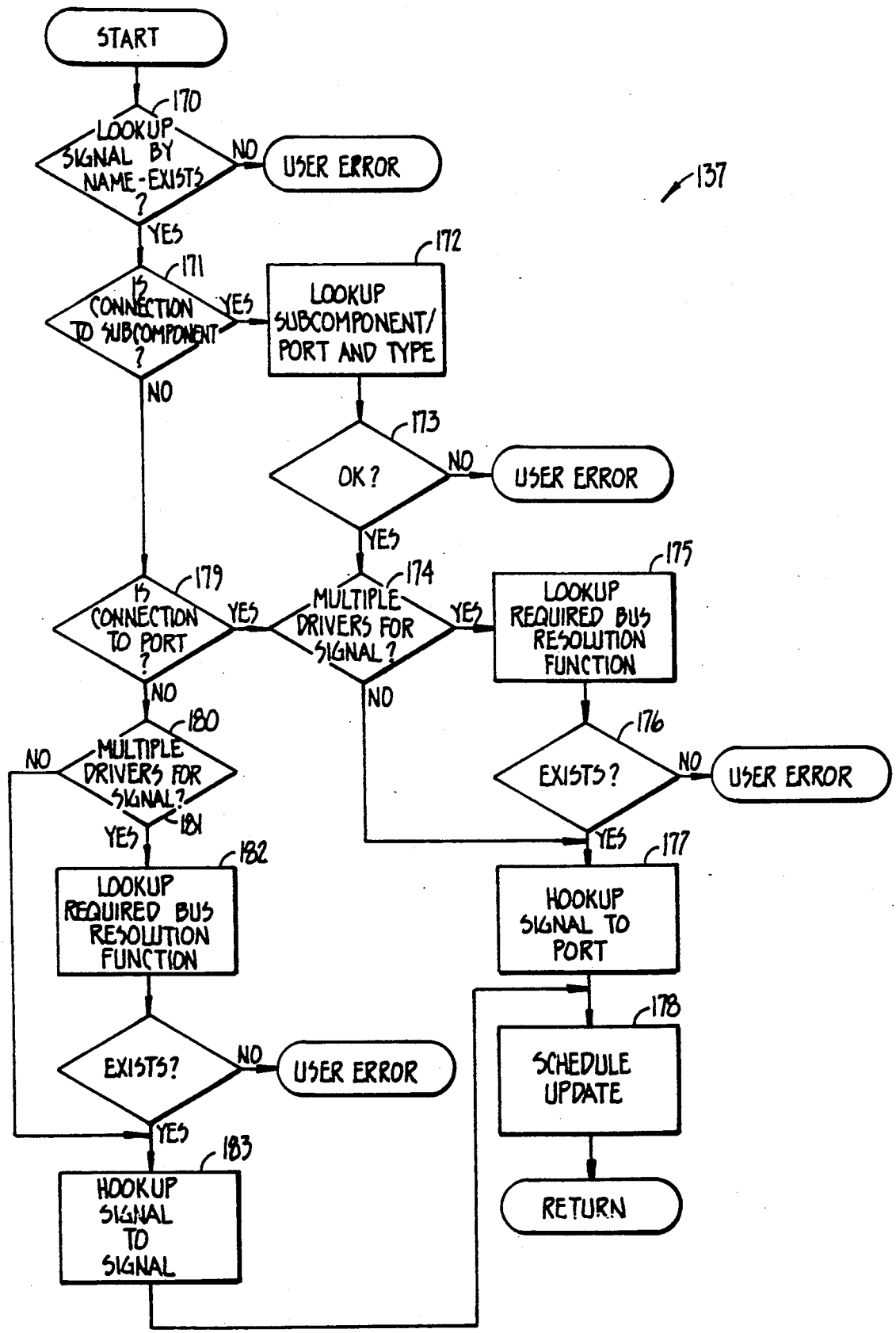
FIG._21.

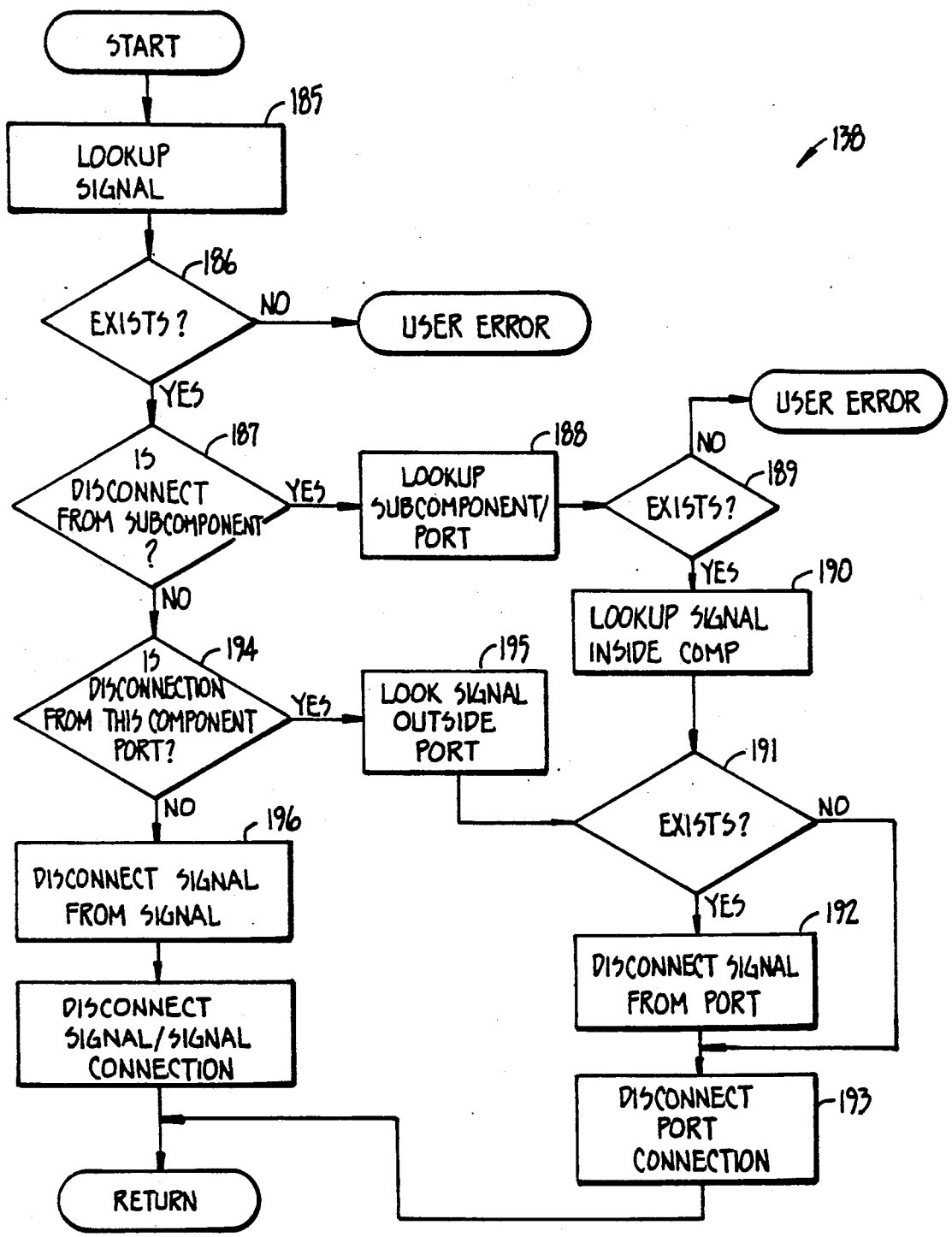
FIG._22.

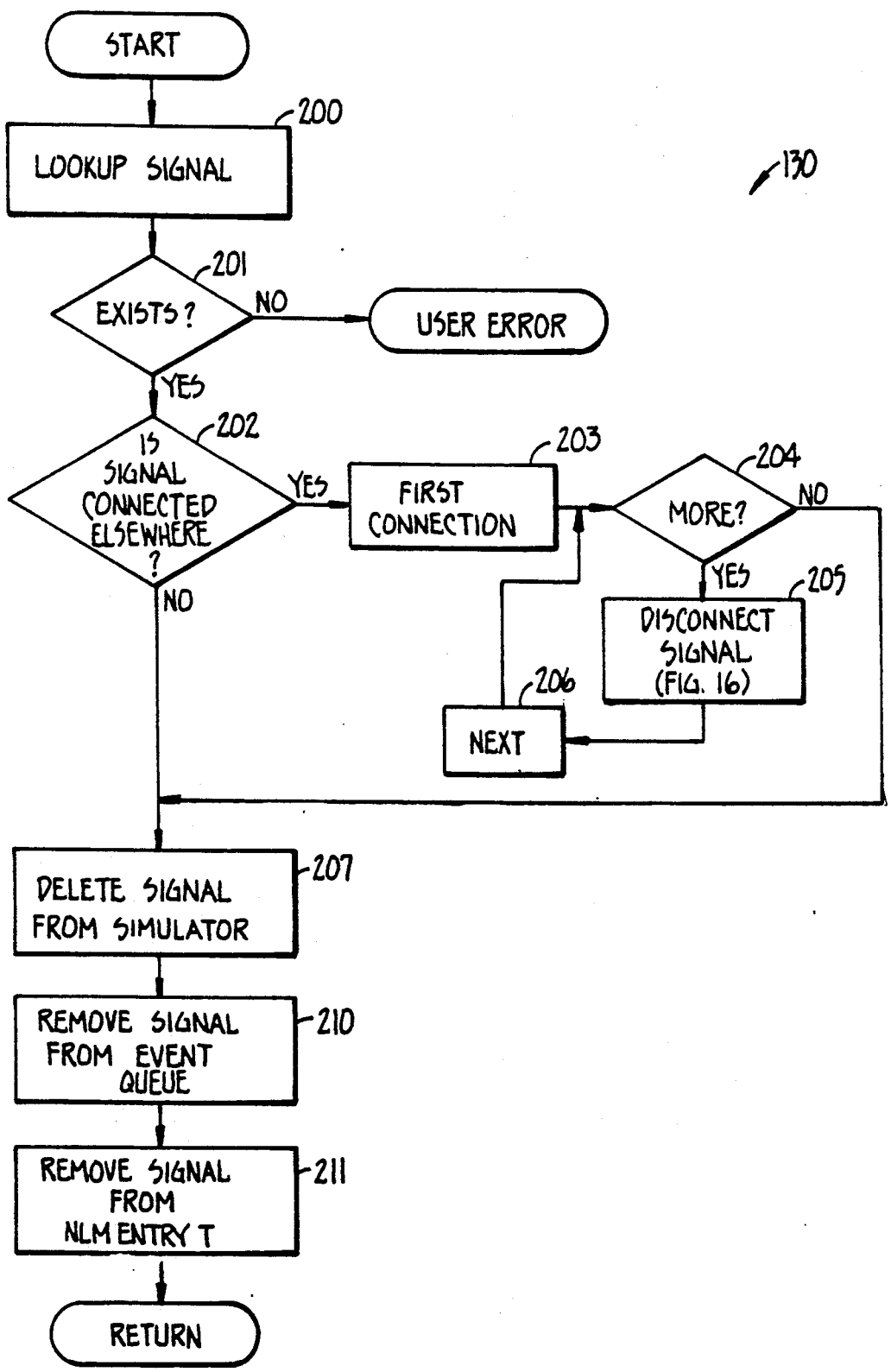
FIG._23.

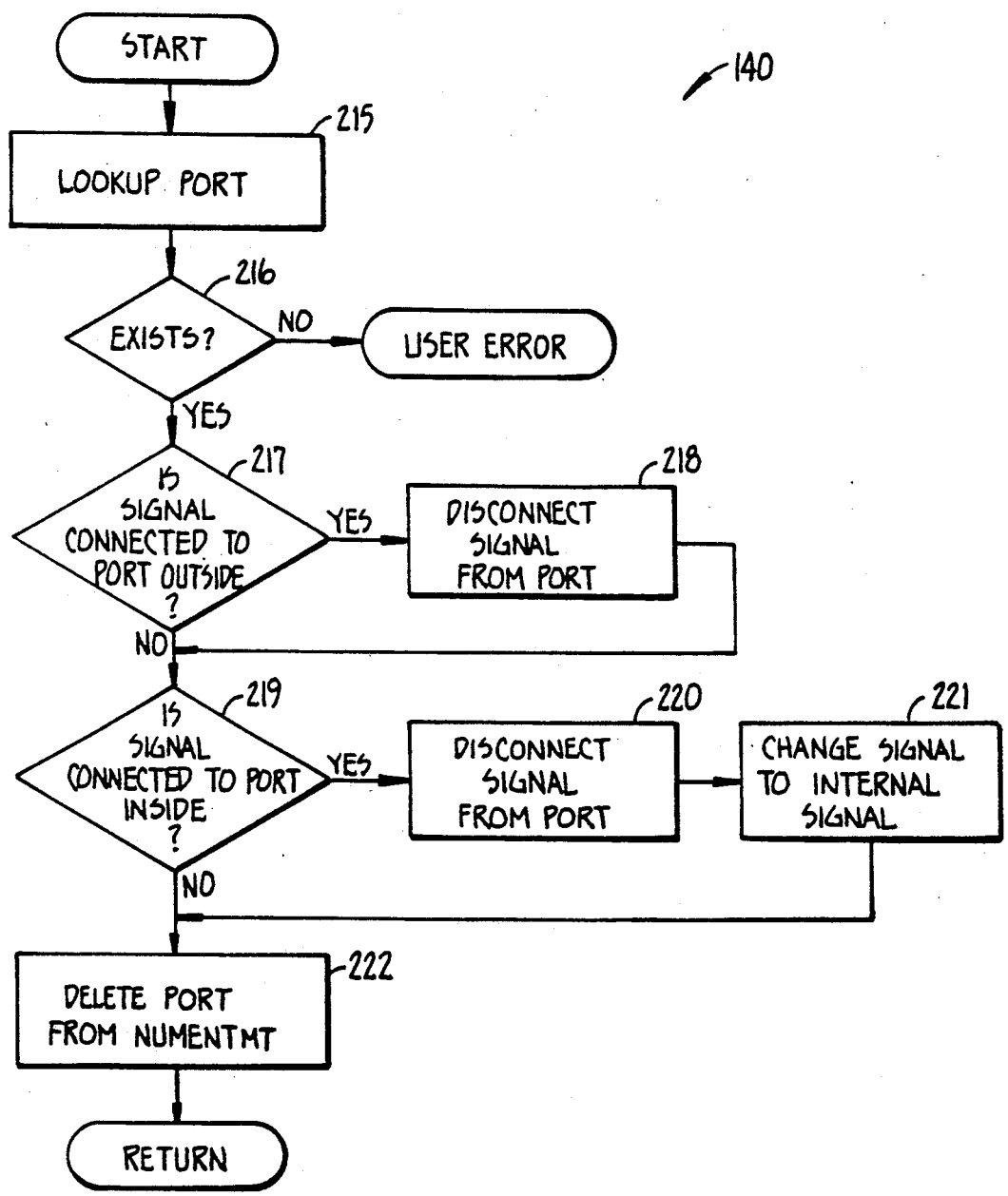
FIG._24.

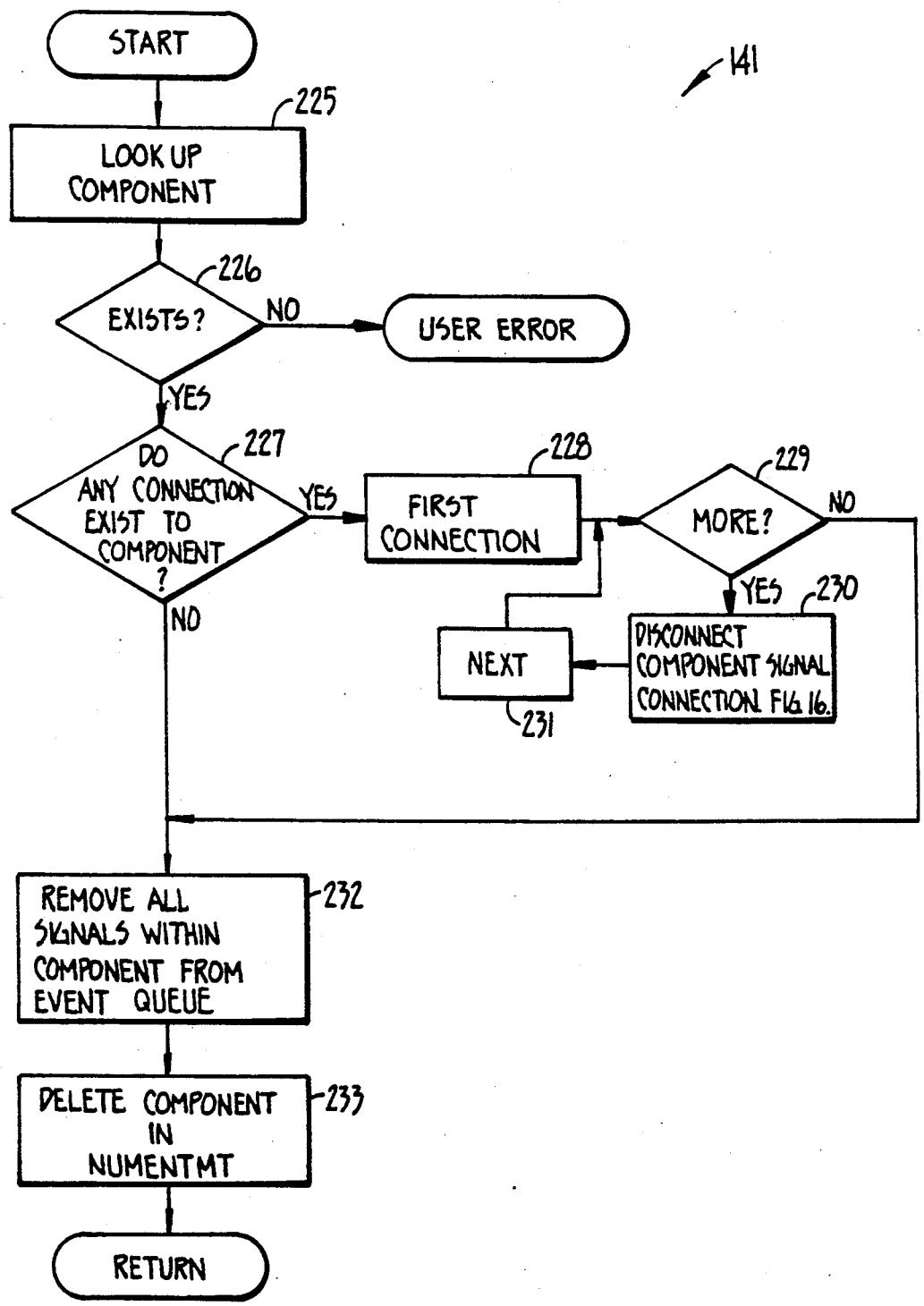
FIG._25.

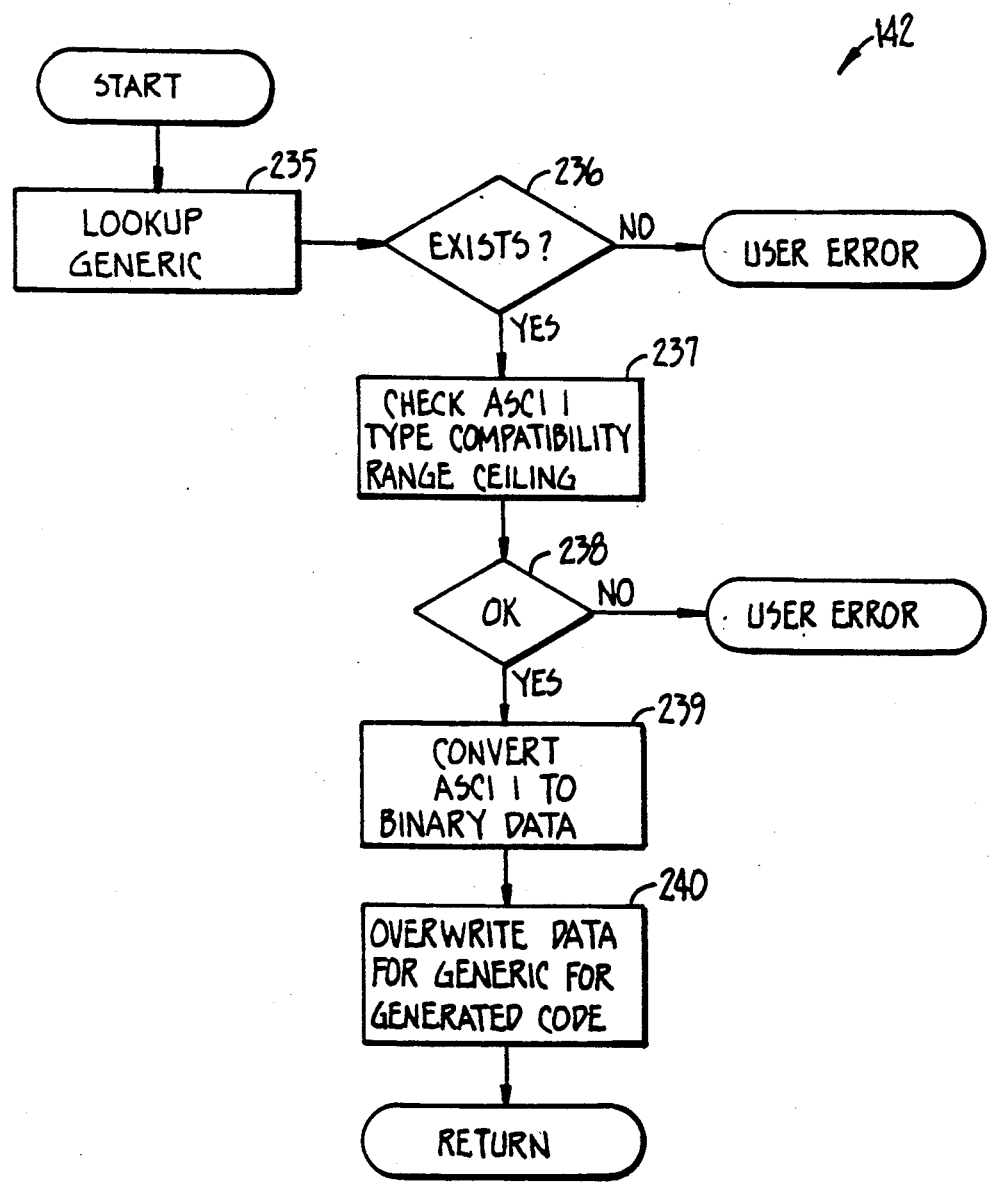
FIG._26.

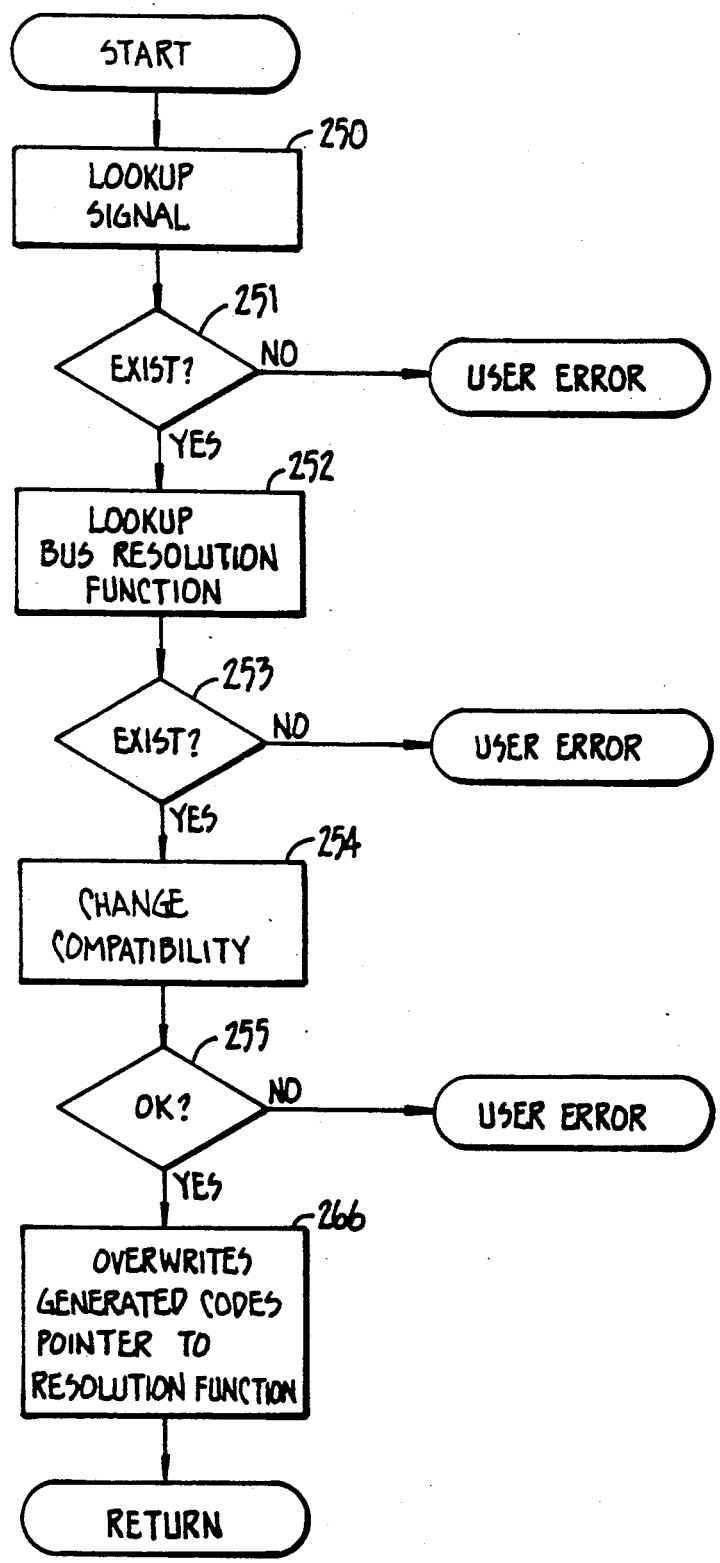
FIG._27.

COMPUTER-AIDED ENGINEERING

MICROFICHE APPENDIX

This application includes a microfiche Appendix 1 having 5 sheets totalling 483 frames.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

This invention relates to a design and simulation method and apparatus for simulating the behavior of systems such as electronic circuits. In particular, the invention provides a method and apparatus for simulating the behavior of an electronic circuit which is being modified in an incremental fashion.

2. Description of the Prior Art

Traditional approaches to the simulation of electronic hardware have been characterized by a loose coupling of schematic capture and simulation tools. This loose coupling has been implemented as an ASCII or binary netlist file which is created by a stand-alone schematic capture system. A stand-alone simulator processes this netlist file as an input during initial startup. In this approach, the netlist file represents a fully expanded circuit description with all schematic hierarchy removed prior to generation of the netlist file. Such computer-aided design tools include those sold by Silvar-Lisco (the Helix System).

In the development of an electronic design, a user of such systems frequently makes incremental changes to the design in order to evaluate alternative designs. A user is forced through the following sequence of operations when making such incremental changes to an electronic design when using the above systems:

1. A schematic editor is started.
2. Changes to the schematic are made in the editor.
3. The schematic is checked for errors.
4. The hierarchy of the schematic is expanded/flattened.
5. A netlist file suitable for simulation is generated.
6. The simulator is started.
7. The simulation is performed and the results are viewed.

The computer processing times to generate the netlist file can be significant (often measured in minutes or hours), and this processing is required for every incremental change made to the electronic design. Further, the simulator must be restarted for each change. As a consequence, the design turn-around time (the time it takes to make an incremental change and proceed to viewing simulation results) often dominates the overall productivity of the user.

Certain systems have been developed (e.g., the Mentor Graphic "QuickSim" simulator) which provide incremental "patching" capabilities during simulation. The ability to change device parameter values during simulation, freeze signal values, change min/max timing values, and make simple patches to the netlist has previously been possible. Such patches have been limited to replacement of gate level components where the number and direction of pins on the replacement part exactly match the component to be replaced and changes are permitted only at the leaf level of hierarchy. Systems which permit patching include "Quicksim" by Mentor Graphics.

From the above it is seen that an improved method and apparatus for performing computer aided design is desired, especially one for use in performing/making incremental changes in the design of an electronic circuit.

SUMMARY OF THE INVENTION

A method and apparatus for simulating electronic hardware is provided. The method and apparatus reduce the processing time required to perform an incremental design change. A user is provided with a schematic editor to make incremental changes to an electronic circuit design without exiting from the simulation environment. A broad range of changes may be made directly to a schematic diagram in a graphical fashion without the need to regenerate an intermediate netlist file.

The user may make a change to the circuit schematic when both the schematic editor and simulator are active. The simulator is updated and the simulation proceeds. The user is then able to view results of the change to the circuit schematic.

Netlist processing traditionally required before simulation can proceed is not required using the invention herein. Furthermore, the simulator and schematic editor are continually active and all changes are updated in the simulator data structures while the simulator continues to run. Further, the user does not need to shut down either tool when changing contexts (moving from running simulator to editing the schematic or vice versa). As a result, the design turn-around time experienced by a user of this environment can be as fast as 2 seconds. A more traditional approach would require minutes to hours of processing. An improved method and apparatus for expanding hierarchical design is also provided.

Accordingly, in one embodiment the invention provides a method of simulating electronic circuits comprising the steps of performing a simulation of a first circuit, the first circuit represented in a netlist data structure, the netlist data structure stored in storage in said computer, the simulation producing at least one response value at a first simulated time; during the simulation of the first circuit, inputting at least one change to the first circuit by entering the at least one change in a graphical schematic capture program executing on a computer, and in response to the at least one change, modifying portions of the netlist data structure affected by the change, the netlist data structure representing a second circuit; and resuming the simulation at a second simulated time with the modified netlist data structure, the at least one response value at a first simulated time used in initiating the resumed simulation.

A digital computer system for simulating performance of an electric circuit in at least two configurations is also disclosed. The computer comprises storage means and execution means as well as means for storing a first netlist data structure in the storage means, the first netlist data structure representing a first circuit configuration; means for simulating at least one response of the first circuit configuration, said means for simulating using the first netlist data structure in the execution means; means for inputting a change to the first netlist data structure during a simulation, the change selected from the group addition of a component, addition of a port, addition of a signal, addition of a connection, deletion of a port, deletion of a signal, and deletion of a connection; means for changing the first netlist data structure, the change to produce a second netlist data structure representing the circuit in a second configuration; and means for continuing the simulation using the at least one response and the second netlist data structure.

A method of modifying a netlist data structure is also disclosed in which the netlist data structure represents an electronic circuit to be simulated. The method comprises the steps of providing a first netlist data structure representing the circuit in a first hierarchical configuration, the first netlist data structure comprising a leaf level and at least one level of hierarchical information above leaf level; inputting a modification to the netlist data structure, the modification representing a change to the circuit at a level of hierarchy above the leaf level; in response to the modification, making a change to the netlist data structure at a level of hierarchy above the leaf level to produce a modified netlist; and providing the modified netlist to a circuit simulator.

BRIEF DESCRIPTION OF THE DRAWINGS

FIG. 1 provides an overview of the method disclosed herein.

FIG. 2 illustrates a plot of the system disclosed herein as it is applied in an Apollo workstation.

FIGS. 3A-3I illustrates the screens displayed to a user in the process of implementing changes to a circuit under simulation and, in particular:

FIG. 3a is a plot of a schematic in SView;

FIG. 3b is a plot of the results display waveforms prior to incremental change;

FIG. 3c illustrates a first incremental change in SView;

FIG. 3d illustrates a first incremental change in SView after an update operation;

FIG. 3e illustrates results display waveforms after a first incremental change;

FIG. 3f illustrates a second incremental change in SView;

FIG. 3g illustrates the results display waveforms after a second incremental change;

FIG. 3h illustrates a third incremental change in SView; and,

FIG. 3i illustrates the results display waveforms after a third incremental change.

FIG. 4 illustrates the SView module structure.

FIG. 5 illustrates operation of SView.

FIG. 6 illustrates the IPC message protocol followed by the SVU module.

FIG. 7 illustrates the organization of NLMLIB.

FIG. 8 illustrates the organization of NICLIB.

FIG. 9 illustrates a signal symbol type table in NLMLIB.

FIG. 10 illustrates the tree of nlmEntryTs.

FIG. 11 illustrates a single example of an nlmEntryT.

FIG. 12 shows the instance data structure.

FIG. 13 shows the instance data arrays.

FIG. 14 is an overview of the hierarchical design expansion.

FIG. 15 illustrates the call to expand in the hierarchical design expansion.

FIG. 16 illustrates the call to create function in the hierarchical design expansion.

FIG. 17 is an overview of the NLM/NICLIB incremental change function.

FIG. 18 is a flowchart of the incremental change/component addition function.

FIG. 19 is a flowchart of the incremental change/port addition function.

FIG. 20 is a flowchart of the incremental change/signal addition function.

FIG. 21 is a flowchart of the incremental change/signal connection function.

FIG. 22 is a flowchart of the incremental change/signal disconnection function.

FIG. 23 is a flowchart of the incremental change/signal deletion function.

FIG. 24 is a flowchart of the incremental change/port deletion function.

FIG. 25 is a flowchart of the incremental change/component deletion.

FIG. 26 is a flowchart of the incremental change/parametric change.

FIG. 27 is a flowchart of the incremental change/change of bus resolution function.

DESCRIPTION OF THE PREFERRED EMBODIMENTS

Contents

I. General Description of the System
II. User Interaction
III. Description of the Layout and Operation of the Primary Modules
  A. SView
  B. NLM
  C. NICLIB
IV. Data Structures
V. Details of Operation—NLMLIB
VI. Details of Operation—NICLIB
VII. Hardware Modelers I. General Description of the System The incremental change system described herein is embedded in a design and simulation system for electronic design. The design and simulation system edits electronic schematics, simulates electronic designs using a behavioral hardware description language, imports and exports design data, and analyzes simulation results. The hardware description language employed is the IEEE 1076-1987 VHDL hardware description language. These languages are described in the *IEEE Standard VHDL Language Reference Manual,* Copyright 1987, which is incorporated herein by reference.

The system is implemented in the "C" programming language, and is operational on the Apollo Systems, Inc. line of engineering workstations. In particular the method may be applied on the DN3000, DN3500, DN4000, and DN4500 models, operating under the Aegis operating system, release 9.6 or later. In addition it has been ported to SUN workstations on the SUN/3 model.

The system has been modularly designed and developed to be system independent, and requires minimal change to rehost on additional workstation platforms. It will be apparent to those of skill in the art that the method could be readily applied in any one of a variety of programming languages and on any one of a variety of workstations without departing from the scope of the invention. The above-described language/hardware are merely illustrative.

FIG. 1 is an overall view of the computer-aided engineering system for design and simulation which contains the incremental change capability disclosed herein. In this illustration, executable applications are represented by rectangles. Data flow between applications, and between applications and files, is depicted by dashed lines. Data communication between applications is shown by solid lines. Files are shown as "wavy" boxes, and the collection of stored data is shown by the design library cylinders. Memory is shown in circles.

Front application 1 is an executable application which starts, stops and synchronizes other applications. Front application 1 also provides design library services such as delete and copy operations of design units for the user. Front application 1 is attached to and interacts with all of the other applications. These connections are not shown in FIG. 1 for simplicity.

VHDL source code 2 is a hardware description language known to those of skill in the art. VHDL 2 is used to document and simulate hardware or software systems. VHDL is entered into the system manually by text, by conversion to VHDL of user-drawn schematics within the VHDL compiler, or by the importation of schematics drawn on other design entry systems such as Mentor Graphics. Each "design unit" described in VHDL is one of: an entity, which is analogous to a symbol; an architecture, which is analogous to a schematic or behavioral description of a component and describes the operation of the entity which defines its interface; a configuration, which is analogous to a socketed board, in which a schematic is configured; or a package or package body, which contains commonly used constants, datatypes, functions, procedures and global signals.

VHDL compiler application 3 receives the VHDL source code 2 via data path 18 and translates the VHDL source code into an intermediate form. "C" compiler 15 takes "C" functions generated by the VHDL compiler via line 19, compiles them, and places them in the design library 5 via line 20. This generated code is exactly generated code 8, which is dynamically linked into a "simulation engine."

SView 4 is a schematic and symbol editor application. SView 4 obtains schematic symbol and netlist data from library 5. Design library 5 also contains compiled VHDL, schematics, symbols, and other design information. Data are transmitted to SView via data line 26. Symbol, schematic, and intermediate form "STX" (schematics text) data are transmitted from SView to the design library via line 27 for saving.

Import/export application 6 imports foreign data 7 from systems such as Mentor Graphics via line 23. These data represent schematics and symbols, and are placed into design library 5 via line 24. Import/export application 6 also exports the changed data to external systems such as those of Mentor Graphics, reports changes made to the schematic by the user in an ASCII file, and exports VHDL source code which may be either the original source, or new source translated from schematics and symbols. SXG (symbol and schematic files) and STX (the intermediate form for translation to VHDL) are placed in the design library via line 24.

Data are also transmitted from design library 5 to import/export 6 via line 25. STX is read and translated to VHDL if a VHDL export operation is requested by the user. In the event that the VHDL is up-to-date or STX does not exist for a design unit in the library, as is the case when the original design unit source was written in VHDL, then VDL is read directly from the library.

The data transmitted from foreign data 7 to import/export 6 can be in the form of Mentor Graphics schematic and symbol information, or EDIF 2 0 0 (Electronic Design Interchange Format).

Data are also exported from import/export 6 as foreign data 7 via line 32. Data produced can be change files produced to update Mentor symbols and schematics with the changes made by the user with SView, log files of changes made, VHDL source code for the user's documentation of the design, or EDIF.

Generated code (GC) 8, kernel 10, and netlist manager (NLM) 11 form simulator 9. Generated code 8 is produced by compiling VHDL 2. Generated code 8 code is dynamically linked to the simulator by NLM 11. NLM 11 constructs a hierarchically expanded netlist and constructs data structures for simulation and incremental change in conjunction with the generated code 8. Data for the creation of signal symbol table information used during simulation as well as the generated code are provided via line 28.

The simulation kernel 10 contains basic event queuing functions used by the simulator 9, as well as code which communicates with simulation control portion (SIMCON) 12. SIMCON 12, along with simulator 9 together act as a simulation application. Separation of the simulator 9 and SIMCON 12 into separate processes greatly improves performance of the simulator because simulation need not be slowed down through interaction with the user. Incremental changes from the schematic editor (SView) 4 to the netlist manager 11, and results of the changes, are communicated via IPC (Inter-Process Communication) channel 16. IPC channel 17 is used to communicate stimulus, breakpoints, and other controls between the simulator 9 and the simulation control 12.

SIMCON 12 is connected to results display (RESDISP) 13. Both RESDISP 13 and SIMCON 12 (as well as other portions of the simulation system) have access to GC 8 and NLM 9 since both are in memory, i.e., shared memory 14 which is local to the simulator.

Memory 14 is shared between two processes, SIMCON/RESDISP and NLM/GC/KERNEL. Data structures containing hierarchical design information are placed in this memory, and a name server module of NLM provides functional access to design hierarchy by both applications. Read/write access from/to the shared memory is provided to NLM via data line 29.

RESDISP 13 and SIMCON 12 form a separate application. SIMCON 12 allows the user to interactively control the simulator, to provide stimulus, set breakpoints, and examine internal values in the simulated design. RESDISP 13 allows the user to see simulation results as waveforms or in ASCII tables. These results can be from the current simulation, as controlled by SIMCON, or the archived results from a previous simulation. Hierarchical design information is provided to RESDISP (via a name server routine-NSRLIB) via line 30 and to SIMCON via line 31.

Information placed into the library as a result of VHDL compilation includes VIF (Vantage Intermediate Format) (an attributed syntax tree describing the VHDL intermediate format), SST (signal symbol table information described later in the section on SSTLIB), and VDL (a copy of VHDL source for debugging, exportation, and recompilation). This information is transmitted from VHDL compiler 3 to libraries 5 via data line 21.

VIF, STX (an intermediate form representation for schematic and symbol data), and VHDL source are transmitted from the library 5 to the VHDL compiler 3 via data line 21. VIF is read by the compiler when the compiler detects a reference to a previously compiled VHDL design unit. STX is read when the compiler detects that the source for a schematic or symbol is more recent than the compiled binary code in the design library for that schematic or symbol, or when one design unit references another which has been more recently compiled. When the compiler detects such a reference to an out-of-date design unit it uses a translation library (TRNLIB) within the compiler to translate the STX into VHDL, compiles that, and then resumes compilation of the suspended unit.

II. User Interaction

A screen plot of the system windows as seen by the user is shown in FIG. 2. Each window in FIG. 2 represents a separate application as seen by the user. Shown are the simulation control window 200, the SView window 201, the results display window 202, the import-/export window 203, the front window 204 and a standard Apollo Aegis shell 205.

Front window 204 is the first window started by the user, and is used to start other applications, and contains design library utilities to delete, move and query the status of design units, such as symbols and schematics. The simulation control window 200 is used to apply stimulus, set breakpoints, and control simulation. It is started from the front window 204.

Results display window 202 shows simulation results, both results from the simulation currently running in the simulation control window, and from previous simulations. The user may view results as either waveforms, as shown, or in an ASCII tabular display (not shown).

Import/export window 203 imports design data from foreign schematic capture systems, exports new or changed designs, reports incremental changes made to the design, and optionally translates the design into source VHDL for the user.

FIGS. 3a to 3i illustrate a typical design session as performed by the user of incremental change. During the session, the simulation control, SView and results display windows are all active, and the user may move easily from one window to the next.

FIG. 3a shows the circuit design used for illustration herein. Table 1 shows the results of simulating the circuit design in FIG. 3a up to 1000 nanoseconds (ns). This plot is made from the simulation control window immediately after applying stimulus and simulation until reaching a breakpoint at time 1000 ns. FIG. 3b shows the results of the simulation in results display.

TABLE 1

SIMULATION_CONTROL IS READY.
THE MAXIMUM SIMULATION TIME SPECIFIED HAS BEEN REACHED.
HALTING AT TIME 1000 NS, AFTER 176 DELTA TIMEPOINTS HAVE BEEN SIMULATED.
INCREMENTAL UPDATE HAS COMPLETED.
ALL PREVIOUS CHECKPOINTS FOR THIS CIRCUIT ARE NOW INVALID.
THE MAXIMUM SIMULATION TIME SPECIFIED HAS BEEN REACHED.

TABLE 1-continued

HALTING AT TIME 2000 NS, AFTER 382 DELTA TIMEPOINTS HAVE BEEN SIMULATED.
INCREMENTAL UPDATE HAS COMPLETED.
ALL PREVIOUS CHECKPOINTS FOR THIS CIRCUIT ARE NOW INVALID.
** ASSERTION WARNING: COMPARE1: SKEW TIME IS TOO GREAT. (SCN/SIM)
** OCCURRED IN /KSERA/SERA/COMP000017 AT TIME 2305 NS AFTER 469 DELTA TIMEPOINTS HAD BEEN SIMULATED.
THE MAXIMUM SIMULATION TIME SPECIFIED HAS BEEN REACHED.
HALTING AT TIME 3000 NS, AFTER 587 DELTA TIMEPOINTS HAVE BEEN SIMULATED.

FIG. 3c shows the schematic after the first incremental change is made. The "AND" gate and "COMP" comparator have been added in the lower right corner of the schematic. At this point the user has selected the "UPDATE" menu selection, which will cause these incremental changes to be sent to the simulator.

FIG. 3d shows the schematic in SView after the update operation is completed, as is shown in the text output area at the bottom of the window. Several signals and two components have been updated. The total elapsed time for the update to occur is 12 seconds.

FIG. 3e shows the results of simulating the design for 1000 ns more, until time 2000 ns. The top two signals in the window, "comp_clk" and "gated_clk," were newly created during the previous incremental change.

FIG. 3c shows the next incremental change performed. In this case, the architecture, or underlying behavior or schematic of the component in the lower right corner of the schematic has been changed. In this way the user can substitute entire hierarchical changes, including behavioral as well a structural changes, as desired. In this example the output behavior of "COMP" is changed, leading to different results on the signal named "comp_clk." This update operation took 7 elapsed seconds.

Table 2 shows the different behavior of "comp_clk" after simulating for 1000 ns more.

FIG. 3g shows the third and final change to the design. In this change, the user selects a new timing value for a generic parameter of "COMP," changing a check for skew time for a 3 ns tolerance to a 5 ns tolerance. Three seconds elapsed during this update operation.

TABLE 2

SIMULATION_CONTROL IS READY.
THE MAXIMUM SIMULATION TIME SPECIFIED HAS BEEN REACHED.
HALTING AT TIME 1000 NS, AFTER 176 DELTA TIMEPOINTS HAVE BEEN SIMULATED.
INCREMENTAL UPDATE HAS COMPLETED.
ALL PREVIOUS CHECKPOINTS FOR THIS CIRCUIT ARE NOW INVALID.
THE MAXIMUM SIMULATION TIME SPECIFIED HAS BEEN REACHED.
HALTING AT TIME 2000 NS, AFTER 382 DELTA TIMEPOINTS HAVE BEEN SIMULATED.
INCREMENTAL UPDATE HAS COMPLETED.
ALL PREVIOUS CHECKPOINTS FOR THIS CIRCUIT ARE NOW INVALID.
** ASSERTION WARNING: COMPARE1: SKEW TIME IS TOO GREAT. (SCN/SIM)
** OCCURRED IN /KSERA/SERA/COMP000017 AT TIME 2305 NS AFTER 469 DELTA TIMEPOINTS HAD BEEN SIMULATED.
THE MAXIMUM SIMULATION TIME SPECIFIED HAS BEEN REACHED.
HALTING AT TIME 3000 NS, AFTER 587 DELTA TIMEPOINTS HAVE BEEN SIMULATED.

TABLE 2-continued

PLOT OUTPUT WRITTEN TO "SIMCON. FIG11.PS".
INCREMENTAL UPDATE HAS COMPLETED.
ALL PREVIOUS CHECKPOINTS FOR THIS CIRCUIT
ARE NOW INVALID.
THE MAXIMUM SIMULATION TIME SPECIFIED HAS
BEEN REACHED.
HALTING AT TIME D4000 NS, AFTER 790 DELTA
TIMEPOINTS HAVE BEEN SIMULATED.

FIG. 3h shows the simulation control window after simulating after this change, from 3000 ns to 4000 ns. FIG. 3i shows the final resulting waveforms in the last 1000 ns of simulation.

After this series of incremental changes, the user may choose to save the changes made, by saving the schematic if the simulation results indicate correct behavior, or the user may discard the changes. The overall design time for the user is dramatically decreased, both by the total interactivity of design editing and simulation and by near instantaneous design turn-around for continued simulation. The benefit for the user is a much faster design cycle, allowing more and easier investigation of alternative designs, and increased reliability of designs from an increasing degree and quality of simulation.

III. Description of the Layout and Operation of the Primary Modules

Source code for one embodiment of the invention is include herewith as Microfiche Appendix and Appendix 1 (not to be printed but available in file). Table 3 provides a list of included files along with their general purpose.

TABLE 3

| File Name | Title | Purpose |
| --- | --- | --- |
| niclib.c | Netlist Incremental Change | Provide incremental change functions. |
| nicverchn.c | Netlist Incremental Change | Provide verification functions for incremental message sent to SView. |
| nicverchnit.h | Netlist Incremental Change | For use with nicverchn.c. |
| nicval.c | Netlist Incremental Change | ASCII to value, value to ASCII functions. |
| nicsup.c. | Netlist Incremental Change | Provide incremental change functions. Supplemental functions. |
| nicchk.c | Netlist Incremental Change | Check proper setup for incremental changes. |
| nicinc.c | Netlist Incremental Change | Provide incremental change functions. Session control and protocol. |
| nicsim.c | Netlist Incremental Change | Provide incremental change functions. Interface to sssstruct.h (kernel). |
| nicdel.c | Netlist Incremental Change | Provide incremental change functions (deletion). |
| nicadd.c | Netlist Incremental Change | Provide incremental change functions. (Adding to netlist.) |
| nicchn | Netlist Incremental Change | Provide incremental change functions (renaming and parameter changing). |
| sssstructt.h | Simulation Kernel Type Declarations | Define the structure types used by the kernel. For defining circuit structure. |
| nlmloa.c | Netlist Manager | Common functions for netlist manager. Called from generated code - load and lookup functions. |
| nlmexp.c | Netlist Manager | Common functions for netlist manager. Expansion functions. (Called from kernel.) |
| nlmdes.c | Netlist Manager | Common functions for netlist manager. Called from generated code - describing a "type." |
| nlmbld.c | Netlist Manager | Common functions for netlist manager. Called from generated code - instantiating components. |
| nlmlibt.h | Netlist Manager Types | System-wide definitions for netlist manager. |
| nlmlibit.h | Netlist Manager Internal Types | System-wide internal type definitions for netlist manager. |
| niclibt.h | Netlist Incremental Change - Type Declarations | Provide incremental update communication SView-NLM. |
| niclibit.h | Netlist Incremental Change - Type Declarations | Internal data structure for niclib. |
| svwlibt.h | SView Window Library Types | Data structures kept per SView window. |
| svclibt.h | SView Change Library Types | Data structures for keeping track of changes made to graphics by users. |
| svmcheck.c | SView Checking Module Code | Performs simple checks to |

TABLE 3-continued

| File Name | Title | Purpose |
| --- | --- | --- |
| | | catch user errors before allowing incremental change to take place. |
| svulibc.h | SView Update Library Constants | Constants used by svulib.c. |
| svulibt.h | SView Update Library Types | Data structures used during incremental change by svulib.c. |
| svulib.c | SView Update Library Code | Incremental module. |
| svxlibc.h | SView Netlist Library Constants | Constants used by svxlib.c. |
| svxlibt.h | SView Netlist Libraray Types | Types used to describe netlists generated by svxlic.c. |
| svxlib.c | SView Netlist Library Code | Generate netlist from symbol schematic information. |
| sstlibit.h | Netlist Manager/Symbol Table - Internal Types | Common internal types for netlist manager/symbol table. |
| sstlibt.h | Type Declarations for Symbol Table Package | Type declarations for symbol table package. |

Referring again to FIG. 1, the portion of the simulation system which pertains directly to incremental change consists of four modules. These are the schematic editor (SView) 4, the netlist manager (NLM) 11, the generated code (GC) 8, and the simulation kernel (Kernel) 10. SView is a program, composed of many modules. NLM, Kernel and GC are bound together to form another separate program, which communicates with SView via IPC (interprocess communication). The primary functions of these modules are given below.

SView is used to construct and modify a logic design or circuit by means of a graphical user interface for editing of a "picture" of the circuit. The schematic editor operates upon a schematic which describes one portion of a level of the design at a time. Typically several levels of design are created by the user to form a hierarchical or nested design, which is then simulated. Incremental changes to the circuit and/or circuit interface, checked for consistency, are sorted and then passed to the netlist manager in order to change a netlist under simulation.

NLM, in conjunction with the generated code, performs the initial expansion of the design (the elaboration phase). A hierarchically expanded netlist is created, preserving hierarchical information for subsequent incremental change. The netlist manager is subsequently used to perform the actual netlist editing operations, resolving changes made to each level of the hierarchy, one level at a time, by the schematic editor which passes to it the sorted list of changes.

GC is generated by the compiler 15 which creates and compiles "C" functions containing compiled instructions to the netlist manager and other runtime libraries to instantiate component and signal data. Two classes of functions are generated. "Execute" functions are transfer functions from component inputs to outputs. "Create" functions instantiate, connect and initialize signal and component data structures used by the simulation kernel and pass this information to the netlist manager. The generate functions are also used in part of the incremental change algorithm.

Kernel uses the netlist data structures created by NLM and GC during the elaboration phase, and modified by NLM as part of the incremental change algorithm. Simulation is performed by the Kernel calling the generated "execute" functions to calculate new predictions for those signals which are activated, scheduling these predictions, advancing to the next simulation delta (a point in simulated time at which at least one signal is active) and processing the active signals at the new delta.

A. SView

The SView program 4 includes several modules. FIG. 4 illustrates the dependencies among the modules in SView by showing a given module above any modules which it uses. Six modules are of primary interest which are illustrated with numerals 33 to 38 in FIG. 4, with the rest of SView represented by the section labeled OTHER. "OTHER" includes graphics functions, user interface, and utility functions including a graphical schematic capture program which are readily used and produced by those of skill in the art.

The six primary modules are SVU 33, SVX 34, SVW 35, SVG 36, SVE 37, and SVC 38. Of these six modules, only SVU and SVX contain significant amounts of code which is important to the discussion herein. The remaining modules contribute data structures which are accessed and manipulated in the SVU and SVX modules.

The SVU module controls the incremental change processing for the SView program. It performs calculations on the data representing the schematic being simulated, using the SVX module to generate the current netlist, and compare it with the previous version of the netlist in order to discover what changes were made. In addition, the list of actual editing changes made by the user (from data structures provided by the SVC module) is consulted to discover changes to parameters and ports. The SVE, SVG, and SVW modules provide data structures which are referenced by the SVU and SVX modules as needed.

FIG. 5 illustrates operation of the SVU module in greater detail. A check 40 is made to determine if at least one change was made to the schematic. If not, then there can be no changes in the netlist and, therefore, no incremental changes. In block 42 the SVX module is called and the current netlist is generated. In block 44 a sorted list of netlist changes is generated by comparison to the previous netlist. In addition, the actual list of editing changes is consulted when searching for certain kinds of changes (mainly those involving parameters and ports). At block 46 a check is made to see if any changes were found. If no changes were found, then no incremental changes are sent to the simulator. At block 48 all of the incremental changes are communicated (via IPC) to the NLM module of the simulation kernel. A check is made at 50 to verify that the changes submitted were accepted. If so, at block 52 the list of editing changes is marked as having been used, so that they are not checked or used again the next time an incremental change update is requested by the user. Finally, at block 54 (in the case of a successful update) the new netlist generated by the SVX module earlier is stored in place of the old netlist. Future incremental change updates will then use the new netlist as the basis for comparisons.

In block 46, changes are detected by scanning a user change list (see svclibt.h for a description of these data structures) looking for appropriate user changes. This method is able to trace the evolution of a given port, for example, through to its final version, to minimize the number of changes which are reported.

Changes to netlists include: use of different VHDL packages; deleted instances; deleted signals; deleted connections between signals and instances; added instances; added signals; added connections between signals and instances; changes to generic parameters on instances; and changes to bus resolution functions on signals.

To detect these changes, SView generates a current version of the netlist for the schematic, using the SVX module mentioned earlier. Signal changes are searched for first, by comparing the two netlists. Any signal which is on the original netlist but not on the new netlist is considered to have been deleted. In such a case all connections for that signal are also to be deleted. Any signal which is on the new netlist but not on the original netlist is considered to have been added. In such a case all connections for that signal are to be added. If a signal is found to exist in both netlists, its connections are compared, and delete and add connection changes are recorded as appropriate. Finally, the user change list is used to discover any changes to bus resolution functions assigned by the user.

Instance changes are calculated in a similar manner, comparing the original and new netlists. One special case must be mentioned: if a given instance exists in both netlists, a check is made to see if the configuration specified for that instance has been changed, since such a change must essentially be treated as a deletion and addition of an instance. Note that there is no need to check for changes in the connections between instances, since that is handled by the signal processing above. Once changes in the list of instances are calculated, a search of the user change list is made to detect changes to generic parameters.

FIG. 6 illustrates the IPC message protocol followed by the SVU module in communicating incremental changes to the NLM module of the simulation kernel. In block 56, the communications channel is opened and initialized. At block 58 an incremental change dialog is initiated, where the context (location in the simulated design) is specified. At block 60, the SVU module waits for an acknowledgement of the context from NLM before continuing. If the context is rejected the incremental change update session is considered to have failed and an appropriate message is indicated. At block 62 change communication processing is started, initializing to the first of the incremental changes. At block 64, the current incremental change is sent to the NLM module for processing. Block 66 illustrates the SVU module receiving and handling IPC messages until the last change sent down is acknowledged. Other forms of IPC which might be received include textual messages for relay to the user. At block 67, the SVU module checks to see if there are any more changes to be sent. If so, block 88 prepares the next change in the list for sending, and control goes back to block 64. If not, control continues with block 69, and the "end of update" message is sent. At block 70, the SVU module waits for the final acknowledgement from the NLM module, to determine the success or failure of the incremental change update session. Once that message is received, the IPC channel is closed at 72, terminating the IPC dialog.

B. NLM

Returning to FIG. 1, it is seen that the NLM module 11 is linked with the kernel 10 and dynamically linked with generated code 8 to form the simulator 9. The SIMCON program 12 is an interactive program used to control the simulator, providing stimulus, breakpointing, tracing, and other control functions. SIMCON 12 and the simulator 9 communicate control and the reporting of simulation results via an Inter-Process Communication (IPC) package.

NLM 11 is composed of four libraries: NICLIB, NSRLIB, SSTLIB and NLMLIB. Of these four, NICLIB and NLMLIB provide incremental change functions. The NLMLIB library provides functions, which when called from generated code 8, construct a hierarchically expanded netlist. The NSRLIB library provides naming services for the other libraries and programs, to centralize access and minimize virtual memory storage requirements. SSTLIB provides symbol table access for signal, variable, constant and generic parameter types used in the hardware description language.

The organization of NLMLIB 72 is illustrated in FIG. 7. NLMLIB constructs the hierarchical netlist for both the initial circuit expansion and its modification during incremental change. NLMLIB is composed of four subsystems, and a collection of utility functions for allocation, de-allocation and lookup of netlist information. The LOA(d) subsystem 73 performs dynamic linking of generated code.

Through the use of dynamic linking, the simulator can execute design-specific functions as translated by the compiler, compiled into binary object module format, without having an explicit and separate linkage and loading step prior to the user invoking the simulator. The EXP(and) subsystem 74 performs the actual expansion of the hierarchical design at simulator initialization (elaboration) time, performing the expansion of individual design units while preserving the design hierarchy above a leaf level, i.e., at a level of hierarchy above the level of a fully expanded and flattened circuit. This allows later alteration of the connectivity at the interfaces of the individual design units above the leaf level. The DES(cribe) subsystem 75 is called by the generated code for each design unit to describe the ports, signals, datatypes, and subcomponents (names and types of the design units hierarchically contained within the design unit being described). The B(ui)LD subsystem 76 is called by the generated code to allocate and initialize the simulation data structures and assign individual instance information for each instance of each design unit to NLM. UTILS 87 contains allocation and initiation functions.

C. NICLIB

FIG. 8 illustrates the internal structure of the NICLIB module 77, which performs the actual incremental changes. IPC connection 78 communicates with SView. The IPC connection is used in three ways. SView sends changes, as described in the section on SView. NICLIB analyzes the changes and reports success or failure back to SView, so that the user can fix any reported problems in the event of an error, or so that SView can mark the changes as accepted in the case that the changes are allowed and correct. The IPC facility is also used in NICLIB to report to the user what changes have been made.

ADD 79 adds components, signals, ports and connections, while DEL 80 deletes components, signals, ports and connections. CHN 81 changes attributes on symbols and components, thus effecting parametric changes in the simulations.

INQ 82 allows SView to inquire about the status of the design under simulation but not directly a part of the process of incremental change.

SIM 83 implements the actual data structure changes of the kernel data structures, primarily the change in which signals are driven by a given signal, and which signals drive a given signal. VER 84 verifies the correctness of all changes prior to actually performing the changes. By using an approach of verifying all changes before actually implementing any of the changes, the changes are guaranteed to be semantically valid, where the semantics of the original hardware description language should be preserved. In this implementation, the checks performed ensure that the retranslation of the schematic or symbol being changed will produce VHDL which will simulate similarly to that of the incrementally modified circuit.

REN 85 permits the renaming of components, signals and ports. Such changes do not alter the actual results of the simulation, but do alter the names displayed through the name server. SVP 86 contains a library of utility functions which aid in modularizing the incremental change code.

IV. Data Structures

Most of the data structures used by NLM and NICLIB are constructed in shared memory by executing the generated code. There are three central data structures in shared memory.

The first, declared in sstlibit.h, consists of a flattened symbol table for signal types. A recursively defined structure allows all abstract data types declarable in the hardware description language to be expressed. This is sstEntryT. Each entry is composed of one of a set of scalar types as enumerated in sstTypeT (declared in sstlibt.h), a constrained subtype of one of these scalars, an array indexed by a scalar type (another sstTypeT) of elements of some type (another sstTypeT), or a record of fields of some type described by an sstTypeT. The complete symbol table is constructed by tying together individual symbol tables from files written by the VHDL compiler for each design unit.

The second and third data structures contain the actual connectivity of the schematic, and preserve the hierarchical information present in each design unit. These two data structures are 1) a tree of "templates" which describe for some component type the names, types and connectivity of signals, ports, and subcomponents of the component type, and 2) an array of instances which are unique signal and component identifiers (two numberings from 1 to the number of signals and components instantiated are used). Each instance for a given component type fits its template exactly. These are described below.

FIG. 10 illustrates the tree of nlmEntryTs. This is a tree of nodes. Each note represents a different type of component in the expanded design; there is one node for each design unit.

FIG. 11 depicts a single example of an nlmEntryT. Each note contains information including:

Its design unit, which is the type of component. In this HDL, this consists of pointers to the names for this library, its entity, architecture configuration and/or package name.

A list (implemented as an extensible array) of its ports. The name, mode (direction of data flow), and signal symbol table type are given.

A list (implemented as an extensible array) of its signals. The name and a signal symbol table type are given.

A list (implemented as an extensible array) of its component types. The component type for each subcomponent is provided by a pointer to some other nlmEntryT.

A list (implemented as an extensible array) of its connections. Connections are given as tuples of signals, primary ports, subcomponents and subcomponent ports by numbering these elements as they appear in the above three lists.

Pointers to the "execute" functions. These are pointers to generated code functions which are dynamically loaded.

A pointer to the "create" function for this nlmEntryT.

Parameter information which includes type information about generic parameters for this component type.

Signal symbol table information used to construct the signal symbol table.

FIG. 12 shows the instance data structure. Each instance is created to implicitly reference the signal, subcomponent and parameter information from its corresponding nlmEntryT. There may be many instances for each nlmEntryT, thus nlmEntryTs are fundamentally templates for instances. The data structure for an instance is declared in nlmlibit.h, and is of the type nlmCmpInstanceT. Instances are managed within an extensible array containing all component instances, as shown in FIG. 13. This array is indexed by the component ID (from 1 to N, where N is the number of all components in the design) and each array entry points to an nlmCmpInstanceT. Each instance contains:

A pointer to its nlmEntryT.

The component ID of its parent component. This is an integer corresponding to some nlmCmpInstance which is the component instance which instantiates this component.

A component number. This is an integer, from 0 to the number of subcomponents which this component's parent contains, which gives this component's position in its parents list of subcomponent types in the subcomponent list of the parents nlmEntryT.

An array from 0 to the number of subcomponents for this component type, containing the subcomponent ID for each subcomponent. The above three pieces of information allow the efficient traversal of all instances of the design, as well as efficient access to all of the component type information.

An array from 0 to the number of signals for this component type, containing the signal IDs for each instantiated signal. Functional access is provided elsewhere for immediate access to any signal data structures created for any signal via its unique signal ID.

Parameter information for instance-specific generic parameter values passed to subcomponents. This information is used both for expanding the hierarchical design as well as incremental change for the actual values of generics.

V. Details of Operation—NLMLIB

Simulation is initiated in the following order, and provides a new method for design expansion, simulation setup and initialization. The user initiates the simulation from front 1, which in turn starts the simulation control or user interface process for the simulator. The simulation kernel is then started. The simulation kernel calls the netlist manager which performs the following steps during the elaboration process:

1. The shared memory is allocated and initialized using UTILS 87 in FIG. 5. The memory is subsequently used by concurrent processes which need access to names and symbol table information for the design under simulation.

2. A signal symbol type table 88, as illustrated in FIG. 9, is created in shared memory. SST 89 implements the functionality for the creation of the symbol table, and functional access for its subsequent use by all processes. The symbol table contains all the data types for signals, variables and constants to be used during the current simulation. As new data types are added through incremental change, this table is updated, allowing concurrent applications access to the new data types used. The signal symbol table is similar to those used in debuggers for high-level language debugging. The data structures used by the signal symbol table construction functions are provided in the "C" language and include files attached entitled "sstlibt.h" and "sstlibit.h."

3. Initial parameters for the top hierarchical circuit are looked up. The symbol table access routines 89 are called by the LOA(d) 73 and EXP(and) 74 functions shown in FIG. 5.

4. The create function for the top hierarchical circuit is loaded into memory and executed by the netlist manager. This dynamically links compiled object modules as they are needed, eliminating any prelinking of the simulator. Dynamic linking consists of reading individual compiled object format files from disk, placing them in memory, and resolving external references such that the newly loaded object can call and be called by other external functions.

5. A top level create function contains two types of compiled instructions: "describe" instructions, and "build" instructions. A third class of instructions, "execute" functions, are dynamically loaded as a side effect of execution of the "describe" instructions. Each component within the design has its own generated create function. The create function describes to the netlist manager 11 each port and signal that any instance of the type will contain. The netlist manager 11 constructs a list containing the names, and types of all signals and ports. The generated code then describes the type of each subcomponent used. This completes the "describe" instructions. The create function then builds each of the signals by allocating memory, initializing it, and calling the netlist manager for a pointer to each signal outside the component (in the case of the top level component there are no outside signals). It then proceeds to interconnect each signal inside the component connected to a port to the signal outside the component connected to the port. The create function then supplies to the netlist manager any parameters which are to be passed to subcomponents at the next lower level. The execute functions for this component type are then loaded, for subsequent use during the simulation cycle. The create function is then complete and control is returned to the netlist manager. "Execute" instructions are called by the kernel 10 in order to perform the transfer functions for the component being modeled, and as such are not directly a part of the expansion process.

6. The netlist manager 11 then looks up and loads the create functions for each of the subcomponent types at the next level. It then calls each of these create functions in a top down, left to right recursive traversal. In this manner, using top down recursive calls to dynamically load create functions, the design's netlist is created.

A more detailed description of the above process is provided in FIGS. 14 through 16. These functions are implemented from calls from NLMLIB/EXP 74, including NLMLIB/LOA 73, NLMLIB/UTILS 87, NLM/SST 89, and indirectly to NLMLIB/DES 75 and NLMLIB/BLD 76.

As illustrated in FIG. 14, the shared memory is initialized in block 89. The root of the design entity tree (file nlmlibit.h, data type nlmEntryPT) and the expansion stack (file nlmlibit.h, data type nlmBldStackT) are initialized to an empty stack.

The top level design entity is looked up in the design library at block 90 and an entry is created and initialized for the top level component type (file nlmlibit.h, data structure nlmEntryT) at block 91.

In block 92, the signal symbol type is read by functions in NLM/SST, which constructs the data structures found in sstlibit.h. The symbol tables do not have to be constructed simultaneously so that the symbol table can be augmented.

Default values are created in block 93 for top level component parameters. By using default values created in block 93 for generic parameters used by the top-level component (found by calls to NLM/SST), the top level component may be instantiated without requiring actual values to be passed to the component. This allows direct simulation of symbols while developing a model library since actual generic values are typically passed to these components.

In block 94 the entry created in block 93 is pushed onto the expansion stack. Thereafter, the EXPAND function is recursively called at block 95 to instantiate the hierarchical design.

Details of the EXPAND algorithm method are provided in FIG. 15. In block 96 the "create" function for the type of the top stack entry is dynamically loaded, if it has not already been loaded. At blocks 97 and 98, if the signal symbol table file for the top stack entry has not been read, it is incrementally read, augmenting the signal symbol table. A check for recursive instantiation of components is then performed in block 99 by checking to determine if the top stack entry appears elsewhere on the design expansion stack. The dynamically-loaded create function for the top stack entry is called in block 100, with a boolean parameter indicating whether it has been called before.

The first subcomponent of the top stack entry is then selected in block 101. Blocks 101, 102, and 103 effectively iterate through the subcomponents of the top stack entry, as they were described in the call to the "create" function. One at a time, each subcomponent is selected.

In block 104, the selected subcomponent entry is pushed onto the design expansion stack and in block 105 the EXPAND algorithm is called recursively. In this order a depth first, left-to-right traversal of the entire hierarchical design is performed. In block 106 the top entry is "popped" from the design expansion stack. The next subcomponent is then selected in block 104. This continues until all subcomponents have been selected, pushed on to the stack and expanded.

FIG. 16 provides additional details of the create function 100. As discussed above, NLM passes to the create function a boolean parameter indicating whether the create function has been previously called. The parameter is tested in block 107. If the function has not previously been called, then the data structure for the entry (file nlmlibit.h, type nlmEntryT) has not been completed, and a "describe" protocol is run, as illustrated in blocks 108 to 112. The "create" function calls NLM to receive parameters which may have been passed for the current instantiation of this component.

More specifically, in block 108, generated code in the "create" function calls the NLM describe function (file nlmdes.c, FIG. 7 label 75) to describe each port (by which means hierarchical connections are made), its name, type of data passed, and mode or direction. Each port is assigned a number from 0 to N-1 where N is the number of ports for this component type. In block 109, signals are described in a manner analogous to ports. Each signal is assigned a number starting with 1 plus the last port number assigned.

Subcomponents are then described in block 110. The name and component type of each subcomponent is passed to NLM, via NLMLIB/DES function calls from the generated code in the "create" function. Each subcomponent is assigned a number from 0 to M-1 where M is the number of subcomponents of this component type. Connections are then described in block 111 by ordered sets of numbers including the signal to which the connection is made, and the component and port numbering for connections to subcomponents.

In block 112, the generated code calls NLM which causes "execute" functions to be dynamically loaded. "Execute" functions are called by the kernel 10 during simulation to evaluate the next output state for signals, and for other transfer functions. They are not directly part of the expansion or incremental change algorithms.

In blocks 113 to 119, the generated code iterates over all ports to inquire from NLM whether there is an exterior signal connected to the port. If so, it uses that signal, and reports this to NLM by calling nlmBldSig 75 in FIG. 3. If there is not an exterior signal, then one is created for the port inside the component, initialized, and the signal is reported to NLM via nlmBldSig.

In blocks 120 to 124, the "create" function iterates through all internal signals for the component, creates them, and reports this to NLM by calling nlmBldSig. The generated code then initializes all signals and state variables in block 125.

The generated code also hooks up signal drivers and other simulation data structures in block 126. These data structures may be subsequently modified during incremental change.

In blocks 127 to 130 the "create" function iterates through the subcomponents and passes to NLM the parameter values for each subcomponent. The "create" function then returns, and expansion continues.

VI. Details of Operation—NICLIB

FIG. 17 provides greater detail of the operation of NICLIB. Objects may be added and deleted in the simulation. Connections between objects may be created and removed, properties of objects, including their names, may be created and removed, and new values for these properties may be created and removed. The method presented here ensures that the simulation results after incremental change match as closely as possible the results expected if the user were to save the changes, recompile and resimulate from the beginning. This preserves the integrity of the simulation during incremental change. Likewise, SView ensures that changes made during the simulation are always consistent with the schematic. The potential error inherent in changing a netlist directly in the simulator and forgetting to update corresponding schematics is completely eliminated.

NICLIB then waits for incremental change messages sent from SView using IPC (see block 131). Each change message from SView is decoded in block 132 into one of the message types indicated by blocks 133 to 144. After each change message, an acknowledge message indicating the success or failure of the change is sent to SView as shown in block 145. After the last change message is sent, the simulation data structures are verified (block 146), and newly created components are scheduled to run. A final acknowledge message is also sent to SView to indicate the end of the update session, as shown in block 147.

Details for each individual change operation illustrated in FIG. 17 are illustrated in more detail in FIGS. 18 through 26.

FIG. 18 illustrates the addition of a component 134. The component is instantiated in the context of the schematic in which it is added. The expansion mechanism in the hierarchical expansion at elaboration time is utilized. In block 148 a check is made to see if a component of the same name already exists. If not in block 149, a check is made to find either (first) the compiled model in memory already dynamically loaded, or (second) an up-to-date compiled model in the design library. If a compiled model is found, generic parameters for the component to be instantiated are collected in block 150. These generic parameters typically include device timing delays, but may control many other aspects of the simulation, and their usage is completely defined by the user in entering VHDL.

The collection of parameters is done in two parts: first the default values for generics which are not specified in the instantiation by SView are looked up using the signal symbol table functions and, second, the actual values specified by SView are converted from ASCII, as entered upon the component as attributes, into the binary form directly used by the generated code. If all required generic parameters are provided, then the algorithm continues. Otherwise a user error has occurred which can be corrected and the "update" command may be reissued (block 151).

The NLM entry type (nlmEntryT) is then added onto the expansion stack (block 152). The identical mechanism used to perform the design expansion is used to instantiate the newly added component. The describe portion of the generate function is duplicated by NICADD in block 153. In block 154 "Expand" is called, this time expanding only the single subcomponent and all of its subcomponents recursively. In block 155 all newly created signals are scheduled for update by placing them and their new values on the event queue, to propagate the correct values onto these signals during the next delta (i.e., the next simulation event time). In the use of hardware modelers (described in Section VII), minor modifications in the "create" function may be made to call a function to allocate an instance of the device on the hardware modeler.

Addition of ports is illustrated in FIG. 19. The port is allocated, and remains unconnected as long as no signal is attached to the port from either inside or outside the current context, which is the interface (symbol) for the current schematic. In block 156 a check is performed to make sure that a port by the specified name does not already exist. Block 157 verifies that the type of the port is known. In the described system ports (and signals) may be of any abstract data type. The verification of the type of port then consists of checking to see whether the type is defined, using the scoping rules of the base hardware description language (HDL). In the described system this is VHDL, which represents a superset of almost all popular hardware description languages to date.

First the local context is searched, and all referenced foreign compilation units are searched. SSTLIB supports this method of scoped searches. Block 158 adds the port, port mode, and type information to the entry type data structure (nlmEntryT) for the type of the context of the current component. In block 158 a check is performed to see if a signal with the same name as the port exists in the current context. If it does not, then the addition of the port is complete, and the algorithm returns. If the signal does exist, then the signal connected to the port on the outside of the component is looked up. If this signal exists, then the two signals (inside and outside) are connected, as shown in block 159. The value from one signal to the other is propagated in the direction of data flow in block 160. The routine returns.

Signal addition 136 is illustrated in FIG. 20. The signal is allocated and initialized to its default value, inheriting the value of the signal or port to which it is connected, if the direction of data flow is from the original signal or port to the new signal. Block 161 checks to determine if a signal with the same name already exists. If one does exist, then a user error is flagged. If not, then the type of the signal is looked-up in the same manner as described above for ports, as shown in block 162. After the signal type is found, then a signal entry is allocated in block 163 in the type description (nlmEntryT) for the current component type. A signal within the generated code data structure is initialized in block 164. The initial signal value may be indicated as an attribute placed on the signal by the user within SView, or by an attribute on the port to which the signal is attached. If no initial value is specified, then the leftmost value of the signal, as a default, is used as indicated by the semantics of the hardware description language. Block 165 determines whether the signal is implicitly connected to a primary (outside) port of the component type in the current context. This implicit connection is a feature of the hardware description language, as represented in schematic form. If such a connection is inferred, then the signal is connected to the signal attached to the port outside the component in block 166. In block 167 the value is propagated from one signal to the other, as indicated by the direction of the port, and an update is scheduled. If the signal is not connected to a port, then blocks 166, 167 and 168 are omitted, and the algorithm returns.

FIG. 21 illustrates addition of a signal connection 137. Signal connections are made to either primary ports, which are the "outside" input and output ports of the current component type, to ports of subcomponents, or directly to other signals. A connection of a signal to a port is implicitly a connection to all signals which may be connected to the port. Block 170 verifies that the signal to be connected actually exists and block 172 determines whether the connection is to a port of some subcomponent, which is a component instantiated in the current type. If the connection is to such a subcomponent, then block 172 looks up the information for the subcomponent, and verifies that the type of the subcomponent port is compatible with the type of the signal. Block 173 verifies the compatibility and issues an error message if a type compatibility problem exists. Block 174 checks to see if multiple drivers will exist for the signal after the connection is completed. If such a condition exists, a resolution function is required. Most simulation systems "hardwire" such a function in the event of multiple sources for a signal, or implement a "latest assignment wins" strategy. The present invention allows the user to program and select their resolution functions. Block 175 looks up the resolution function, which uses the same scoping and lookup algorithm as defined above for signal types, and verifies the type compatibility of the returned value of the function with the type of the to-be-resolved signal in block 176. Block 177 hooks-up the signal to the port, and block 178 schedules an update for the signal. In block 177 a signal may or may not exist connected to the port inside the subcomponent. Both the type entry (nlmEntryT) and the generated code data structure are modified, the latter only when the signal exists inside the subcomponent. If the connection is not to a subcomponent part, as determined in block 171, then it is either a connection to a primary port, or to another signal in the current component type. Block 179 determines whether the connection is to a primary port. If this is the case, then the same blocks 174 to 178 are executed, with the connections being made one level higher in the hierarchy. Block 180 covers the case where the connection is made directly to a signal. This case occurs in the event of a connection to a global signal. Block 181 and 182 ensure correct handling for signals which must be resolved, as described above. Block 183 differs from a connection to a port in that the signal connection is made directly, and a connection to a signal is added to the component type data structure (nlmEntryT). The algorithm then returns.

FIG. 22 illustrates disconnection of a signal 138. Signals are disconnected from both their component type representations (nlmEntryT) and their instantiated signal data structures as constructed by the generated code. Block 185 looks up the signal and block 186 verifies that the signal exists. Block 187 determines whether the disconnection is from a subcomponent. In this case, block 188 looks up the subcomponent port and verifies that this connection exists (in nlmEntryT) in block 189. Block 190 looks up the signal inside the component, if it exists. If the inside signal exists as determined in block 191, then block 192 disconnects the signal from the port in the generated code data structure. Then, in either case, it is disconnected from the port in block 193 in the component type data structure. The algorithm then returns. If the disconnection is from a primary port, then the signal outside the component is looked up in block 195. The algorithm then proceeds as per the case of disconnection from a subcomponent port, one level higher in the hierarchy. If the disconnection is from a signal, in the case of a signal driving another signal directly within the same level of the hierarchy or a global signal, then the disconnection is made in the generated code's data structures, as shown in block 196, and the disconnection is made in the component type also (nlmEntryT). The algorithm then returns.

Signals are disconnected from signals in the following way. The signal inside is disconnected from the signal outside depending upon the direction of the port. All signals maintain a list of signals which they drive, and signals by which they are driven. The content of the "driven-by" and "drives" lists is determined by the mode of the port. Ports may be of three basic flavors: "IN" in which the direction of data is flowing into the component, "OUT" in which the direction of data is flowing out of the component, and "INOUT" in which the data flows in both directions. If the port mode in "IN" or "INOUT" (data flow is bidirectional) then the outside signal's driver of the inner signal is removed from the list, and the inner signals "driven-by" list entry is removed. If the mode is "OUT" or "INOUT" then the "driven-by" entry of the outer signal is removed, and the "drives" entry of the inner signal is removed. In the case where a signal has been optimized, or passed through a port as the same signal, then it is the same signal contained on the outside and inside of a component. In this case a copy of the signal is first made, temporarily forming two separate lists, and all signals contained wholly outside the signal are modified to point at the original signal, and all signals contained wholly inside of the component are set to point to the copy of the original signal. The "drives" and "driven-by" entries are both modified thusly. This signal "cloning" algorithm then allows a significant optimization in space and speed requirements. Since "signal drives signal" event propagation occurs without introducing any deltas in simulation, the optimization of such signals is invisible to the user of the system.

FIG. 23 illustrates signal deletion. In block 200 the signal to be deleted is looked up. If it exists (block 201) then in block 202 a check is made to see if the signal is connected to any ports or other signals. Blocks 203, 204, 205, and 206 iterate through all such connections, and delete them using the algorithm described in FIG. 16, one at a time. Block 207 then deletes the signal from the simulator. In block 210 the signal is removed in all instances in which it may be found on the event queue of the kernel. Block 211 then removes the signal from the component type data structure (nlmEntryT.)

Port deletion is illustrated in FIG. 24. Ports are deleted from the current component, and any signal to which they are attached, either inside or outside of the current component type, are disconnected. In block 215 the port is looked up, and if it exists (block 216), the port deletion algorithm continues. In block 217 a check is made to see if there is any signal connected to the port outside the component (up one level of hierarchy). If such a signal exists, and a signal exists to which the port is connected internally, then block 218 disconnects the outside signal from the port, as illustrated in FIG. 22. Block 219 checks to see if a signal is connected to the port inside the current component. If such a signal exists, then it also is disconnected as shown in FIG. 22.

Block 221 changes the signal which was connected to the port into an internal signal. Finally, in block 222, the port is deleted from the component type data structure (nlmEntryT) and the algorithm returns.

FIG. 25 illustrates component deletion. Block 225 looks up the subcomponent to be deleted from the current component type, by name. If the component is found, in block 226, then a check is made to see if any connections to the subcomponent's ports exist, in block 227. If connections to the subcomponent's ports do exist, then blocks 228, 229, 230, and 231 iterate through all such connections, applying block 230 which disconnects the signal to subcomponent port as shown in FIG. 16. Block 232 is recursively applied to delete all signals within the component from the event queue, so that no internal signal activity remains within the component to be removed. Block 233 deletes the component from the component type data structure, and the algorithm returns.

If a hardware-modeled deice is deleted as a result of this operation, then a call is made to the hardware modeler's library to release the resource allocated by the modeler.

FIG. 26 illustrates parametric change. Parametric changes to the simulated design involve specifying new values for parameters which are used by the compiled hardware description language. Such parameters, attributes, or properties are known as "generic" parameters in the hardware description language used. The compiled descriptions access directly the binary data and use the value for a wide variety of purposes, which are determined by the model develope. Typical uses include generic specification of delay values, in which specific values are used for each instantiation of a component using these generics. These generic parameters are modified by the user for the symbol, thus specifying a new "default" value for the parameterized component type, or upon each instance of a component of that type. Block 235 looks up the generic parameter by name, and returns its type. If this is found in block 236, a check is performed to ensure that the ASCII value specified in the schematic for the generic value is of the correct type for the generic, and in the correct range. This is performed in block 237. If OK (block 238) block 239 converts the ASCII value to the binary form which is the identical to the compiled image for that generic type. Block 240 overwrites the data for the actual generic value used by the generated code. Subsequent memory accesses by the "execute" functions of the generated code of the actual generic value use the new value. There is no limit to the number of generics which may be so modified. NICLIB thus changes any freeform ASCII representation to its compiled form, including, but not limited to boolean, real, integer, enumerated and time generic parameters.

Changes of bus resolution functions is illustrated in FIG. 27. Resolution functions resolve the condition in which multiple signals drive the same wire, thus creating what is commonly referred to as a wired function. The hardware description language allows user-definition of this effect, and the incremental change system allows dynamic respecification of the function to be applied. The schematic editor is used for this purpose by the user, who specifies the function by using its name as an attribute value for the signal.

Block 250 looks up the signal with a resolution function to be changed. If the signal exists, in block 251, then the resolution function is looked up, using the SSTLIB module to find the correct scope. Block 253 checks to see if such a resolution function is found. Block 254 determines if the new resolution function is type-compatible with the signal, and this is checked in block 255. In block 256, the memory address of the dynamically-loaded resolution function is looked up (these functions are described to NLM via calls made from the generated code in the "create" function), and the current pointer to the resolution function is overwritten by the newly specified function. Upon subsequent "colliding" events on the resolved signal, the kernel calls the new resolution function to determine the correct wired function.

VII. Hardware Modelers (otherwise known as physical modelers)

It will be apparent to those of skill in the art that the above-described method could readily be applied by those of skill in the art to a hardware modeler (for example a LM1000 made by Logic Modeling Systems, Inc.). In this case, rather than modeling a component using a hardware description language, the physical device is attached to a tester-like hardware modeler. The simulator applies stimulus to the hardware modeler, and the hardware modeler samples data returning from the device, and enqueues the changed data for the rest of the circuit modeled in software. Within the incremental change system, the user can add hardware-modeled devices, delete them, and may make signal connections and disconnections from these hardware modelers.

By using the above-described method in a physical modeler, all changes the designer makes to a breadboard are retained in the schematic diagram, so the designer has no need to manually retrace the changes from the breadboard back to the schematic. This environment also avoids the difficulty associated with physically rewiring devices since the physical modeler provides these facilities through software support.

The user edits his schematic as described above, viewing circuit operation in the accompanied waveform display window. Each symbol in the schematic is linked to the appropriate physical modeling chip. It is possible to have more than one instance of a schematic symbol, with each referencing the same physical model since the environment automatically performs this mapping. The designer is free to make real-time changes to the schematic diagram and update the physical modeling environment to reflect this change in the breadboard without exiting the simulation. The user can also modify the circuit stimulus without exiting the simulator or restarting the physical modeler.

Often, early in the design cycle it is useful to begin initially with behavioral models which represent the various blocks in a design. As the design is refined, and standard components or completed ASICs become available, the physical modeler can be utilized to provide the actual devices. Finally, certain parts of the design may have gate-level schematics mixed with these physical and behavioral models. All of the following types of models may be combined in a multi-level behavioral simulation environment:

physical models (actual chips);
behavioral models (in VHDL); and
gate-level schematics.

By allowing a mixture of all three methods of describing blocks in the design, the user has the flexibility to perform hybrid software/breadboard analysis of the design. Initially, the designer begins with a high-level behavioral model which represents each major block in the system or the entire system. As each block is refined and decomposed into lower-level schematics, multilevel simulations are required. As each ASIC or standard component (such as a microprocessor) becomes available, the designer may simulate the entire system. This is possible at any point in the design cycle since the system allows mixing of actual chips with both structural schematics and behavioral models (which represent parts of the overall design which haven't been completed or fabricated yet).

It is to be understood that the above description is intended to be illustrative and not restrictive. Many variations to the above-described method and apparatus will be readily apparent to those of skill in the art. For example, while the description has been made primarily with reference to electronic circuit design, it will be apparent that the method and apparatus would have application in the design of process systems, the design of linkages, and the like. The scope of the invention should, therefore, be determined not with reference to the above description, but, instead, should be determined with reference to the appended claims, along with their full scope of equivalents.

What is claimed is:

1. In an appropriately programmed digital computer, a method of simulating electronic circuits comprising the steps of:
    a) performing a simulation of a first circuit, said first circuit represented in a first netlist data structure, said first netlist data structure stored in storage in said computer, said simulation producing at least one response value at a first simulated time;
    b) during said simulation of said first circuit:
        i) inputting at least one change to said first circuit by entering said at least one change in a graphical schematic capture program executing on said computer, said graphical schematic capture program inputting user changes with a graphical user interface illustrating electrical components and their interconnections; and
        ii) in response to said at least one change, modifying portions of said first netlist data structure affected by said change to produce a modified netlist data structure, said modified netlist data structure representing a second circuit; and
    c) resuming said simulation at a next, later simulated time with said modified netlist data structure, said at least one response value at a first simulated time used in initiating said resumed simulation.

2. A method as recited in claim 1, wherein said change is selected from the group addition of a port signal and deletion of a port signal in at least two levels of hierarchy.

3. The method as recited in claim 1, wherein said change is changing of a parameter.

4. The method as recited in claim 1 further comprising the step of providing output, said output indicating a response of said second circuit.

5. The method as recited in claim 1, wherein said storage is shared memory, said shared memory used during said simulation step and said modifying step.

6. The method as recited in claim 1, wherein said graphical schematic capture program communicates said change to said netlist data structure via interprocess communication.

7. The method as recited in claim 1 further comprising the step of communicating control information from a simulation control for said simulation via interprocess communication.

8. The method as recited in claim 1, wherein the step of modifying said netlist data structure is preceded by the step of verifying said at least one change to determine if said change is semantically valid.

9. The method as recited in claim 1, wherein the step of performing a simulation of a first circuit is preceded by the step of creating a first netlist data structure, said first netlist data structure containing hierarchical information used in said step of modifying such that changes can be made to hierarchical levels above a leaf level.

10. The method as recited in claim 9 further comprising the step of creating a signal symbol type table, each signal represented in said table having an associated data type.

11. The method as recited in claim 10, wherein said signal symbol type table contains data types for signals, variables, and constants used during said simulation.

12. The method as recited in claim 11, wherein said table is updated in said step of modifying.

13. The method as recited in claim 1, wherein generated simulation code is dynamically linked in compiled object modules as they are needed.

14. The method as recited in claim 1, wherein at least a portion of said simulation is performed with inputs from a hardware modeler.

15. A digital computer system for simulating performance of an electric circuit in at least two configurations, said computer comprising storage means and execution means, comprising:
a) means for storing a first netlist data structure in said storage means, said first netlist data structure representing a first circuit configuration;
b) means for simulating at least one response of said first circuit configuration, said means for simulating using said first netlist data structure in said execution means;
c) means for inputting a change to said first netlist data structure during a simulation, said change selected from the group addition of a component, addition of a port, addition of a signal, addition of a connection, deletion of a port, deletion of a signal, and deletion of a connection;
d) means for changing said first netlist data structure in response to said change to produce a second netlist data structure representing said circuit in a second configuration; and
e) means for continuing said simulation at a next, later simulated time using aid at least one response and said second netlist data structure.

16. Apparatus as recited in claim 15 further comprising means for displaying a response of said circuit in said second configuration.

17. Apparatus as recited in claim 16, wherein said means for storing is shared by said means for simulating and said means for changing.

18. Apparatus as recited in claim 17 further comprising second means for storing, said second means for storing comprising memory local to said means for inputting a change.

19. Apparatus as recited in claim 15, further comprising interprocess communication means for communicating information between said means for simulating and said means for inputting a change.

20. Apparatus as recited in claim 15 further comprising means for controlling said means for simulating, said means for simulating and said means for controlling being linked by an interprocess communication means.

21. Apparatus as recited in claim 15 further comprising means for inputting response from at least one hardware component to said means for simulating.

22. In a programmed digital computer, a method of simulating a response of an entity in at least a first configuration and a second configuration, said entity initially represented by input and output structure and a first netlist data structure, the method comprising the steps of:
a) performing a simulation of said entity in a first configuration using said first netlist data structure, said simulation providing at least one response value at a first simulated time;
b) during said simulation:
   i) inputting at least one change to said first configuration in a graphical schematic capture program, said change selected from the group consisting of addition of a component, addition of a connection, deletion of a component, and deletion of a connection; and
   ii) based on said at least one change, modifying portions of said netlist data structure affected by said change to produce a modified netlist data structure, said modified netlist data structure representing said second configuration; and
c) resuming said simulation based on said modified netlist data structure at a next, later simulated time, said at least one response value at a first simulated time used in initiating said step of resuming.

23. In a programmed digital computer, a method of simulating electronic circuits comprising the steps of:
a) performing a simulation of a first circuit, said first circuit represented in a netlist data structure, said netlist data structure in storage in said computer, said simulation producing at least one response value at a first simulated time;
b) during said simulation of a first circuit:
   i) inputting at least one change to said circuit, said change made above a leaf level of a hierarchy of said circuit and selected from the group addition of a component, addition of a port signal, addition of a connection, deletion of a port signal, deletion of a component, and deletion of a connection; and
   ii) based on said at least one change, modifying portions of said netlist data structure affected by said change above said leaf level to produce a modified netlist data structure; and
c) resuming said simulation at a next, later simulated time with said modified netlist data structure, said at least one response value at a first simulated time used in initiating said step of resuming.

24. The method as recited in claim 23 further comprising the step of providing output, said output indicating a response of said second circuit.

25. The method as recited in claim 23, wherein said storage is shared memory, said shared memory shared between said simulation step and said modifying step.

26. The method as recited in claim 23, wherein inputting step uses local memory separate from said shared memory.

27. The method as recited in claim 23, wherein the step of inputting at least one change is a step of modifying a logic design or circuit in a graphical interface.

28. The method as recited in claim 23, wherein the step of modifying said netlist data structure is preceded by the step of verifying said at least one change to determine if said change is semantically valid.

29. The method as recited in claim 23, wherein the step of performing a simulation is preceded by the step of creating a first netlist data structure, said first netlist data structure containing hierarchical information used in said step of modifying such that changes can be made to hierarchical levels above a leaf level.

30. The method as recited in claim 29, wherein the step of creating a first netlist data structure further comprises the step of creating a signal symbol type table.

31. The method as recited in claim 30, wherein said signal symbol type table contains data types for signals, variables, and constants used during said simulation.

32. The method as recited in claim 31, wherein said table is updated in said step of modifying.

33. A method of modifying a netlist data structure, said netlist data structure representing an electronic circuit to be simulated, comprising the steps of:
 a) providing a first netlist data structure representing said circuit in a first hierarchical configuration, said first netlist data structure comprising a leaf level and at least one level of hierarchical information above said leaf level;
 b) inputting a modification to said netlist data structure, said modification representing a change to said circuit at a level of hierarchy above said leaf level;
 c) in response to said modification making a change to said netlist data structure at a level of hierarchy above a leaf level to produce a modified netlist; and
 d) providing said modified netlist to a circuit simulator.

* * * * *